US012727334B2

(12) United States Patent
Jung

(10) Patent No.: US 12,727,334 B2
(45) Date of Patent: Sep. 1, 2026

(54) DISPLAY DEVICE INCLUDING A PAD STRUCTURE SHARING MATERIAL WITH BANK STRUCTURE

(71) Applicant: SAMSUNG DISPLAY CO., LTD., Yongin-si (KR)

(72) Inventor: In Young Jung, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 406 days.

(21) Appl. No.: 18/355,321

(22) Filed: Jul. 19, 2023

(65) Prior Publication Data

US 2023/0363211 A1 Nov. 9, 2023

(30) Foreign Application Priority Data

Nov. 1, 2022 (KR) ........................ 10-2022-0143823

(51) Int. Cl.

*H10K 59/12* (2023.01)
*H10K 59/122* (2023.01)
*H10K 59/131* (2023.01)
*H10K 59/40* (2023.01)

(Continued)

(52) U.S. Cl.

CPC ......... *H10K 59/122* (2023.02); *H10K 59/131* (2023.02); *H10K 59/40* (2023.02);

(Continued)

(58) Field of Classification Search

CPC .... H10K 59/122; H10K 59/131; H10K 59/40; H10K 59/873; H10K 59/38; H10K 59/1213; H10K 59/123; H10K 59/124; H10K 59/12; H10K 50/11; H10K 50/81; H10K 50/822; H10K 50/844;

(Continued)

(56) References Cited

U.S. PATENT DOCUMENTS 7,276,453 B2 * 10/2007 Truong .................. H10K 71/12 438/30
2006/0139254 A1 * 6/2006 Hayakawa ........... G09G 3/3216 345/76

(Continued)

FOREIGN PATENT DOCUMENTS

CN 102132441 A * 7/2011 ............. H05B 33/14
CN 103824964 5/2014

(Continued)

*Primary Examiner* — Ida M Soward

(74) *Attorney, Agent, or Firm* — F. CHAU & ASSOCIATES, LLC

(57) ABSTRACT

A display device includes a display area and a pad area. Pixel electrodes are disposed in the display area. An inorganic insulating layer is disposed in the display area and partially on the pixel electrode. A bank structure is disposed on the inorganic insulating layer. A pad structure is disposed in the pad area and is electrically connected to a fan-out line disposed in the pad area and the display area. Light emitting layers are disposed on the pixel electrodes and in openings of the bank structure. Common electrodes are disposed on the light emitting layers and in the openings of the bank structure. The bank structure includes multiple first bank layers including different metal materials. One of the bank layers and the pad layer includes a tip protruding from a sidewall thereof.

20 Claims, 26 Drawing Sheets

(51) Int. Cl.
*H10K 59/80* (2023.01)
*G06F 3/041* (2006.01)
*G06F 3/044* (2006.01)

(52) U.S. Cl.
CPC ......... *H10K 59/873* (2023.02); *G06F 3/0416* (2013.01); *G06F 3/044* (2013.01); *H10K 59/12* (2023.02)

(58) Field of Classification Search
CPC ..... H10K 50/865; G06F 3/0416; G06F 3/044; G06F 3/0443; G06F 3/0446; G06F 3/0412
See application file for complete search history.

(56) References Cited

U.S. PATENT DOCUMENTS

| | | | | |
|---|---|---|---|---|
| 2019/0019851 | A1* | 1/2019 | Chen | H10K 71/233 |
| 2019/0334120 | A1* | 10/2019 | Seo | H10K 59/121 |
| 2020/0006700 | A1* | 1/2020 | Kim | H10K 59/60 |
| 2020/0168670 | A1* | 5/2020 | Kim | H10K 59/1213 |
| 2020/0251678 | A1* | 8/2020 | Song | H10K 59/80522 |
| 2021/0064213 | A1* | 3/2021 | Yang | G06F 3/044 |
| 2021/0066419 | A1* | 3/2021 | Byun | H10K 59/122 |
| 2021/0359247 | A1* | 11/2021 | Wang | H10K 71/621 |
| 2022/0199699 | A1* | 6/2022 | Lee | G06F 3/0412 |
| 2022/0208904 | A1* | 6/2022 | Lee | H10K 50/844 |
| 2023/0059042 | A1* | 2/2023 | Lee | H10K 59/88 |
| 2024/0164183 | A1* | 5/2024 | Xie | H10K 59/131 |

FOREIGN PATENT DOCUMENTS

| | | | | | |
|---|---|---|---|---|---|
| CN | 111463238 | A | * | 7/2020 | H10K 59/352 |
| KR | 10-2017-0140764 | | | 12/2017 | |
| KR | 10-2017-0141840 | | | 12/2017 | |
| KR | 20200076278 | A | * | 6/2020 | H10K 50/8428 |
| KR | 10-2021-0168617 | | | 12/2021 | |

* cited by examiner

DISPLAY DEVICE INCLUDING A PAD STRUCTURE SHARING MATERIAL WITH BANK STRUCTURE

CROSS-REFERENCE TO RELATED APPLICATION

This application claims priority under 35 U.S.C. § 119 to Korean Patent Application No. 10-2022-0143823, filed on Nov. 1, 2022 in the Korean Intellectual Property Office, the contents of which are herein incorporated by reference in its entirety.

TECHNICAL FIELD

The disclosure relates to a display device and, more particularly, to a display device including a pad structure sharing material with a bank structure.

DISCUSSION OF THE RELATED ART

Display devices are playing an increasingly important role in modern devices. For example, display devices are employed in various electronic devices such as smartphones, digital cameras, laptop computers, navigation devices, and smart televisions. Examples of modern display devices include flat panel display devices such as a liquid crystal display (LCD) devices, a field emission display devices, and an organic light emitting diode (OLED) display device. Some display devices are considered to be light emitting, since each pixel includes a light emitting element capable of emitting light by itself, thereby allowing for the display of an image without the need for a backlight unit.

SUMMARY

A display device includes a display area and a pad area disposed on one side of the display area. Pixel electrodes are disposed in the display area and are spaced apart from each other. An inorganic insulating layer is disposed in the display area and is partially disposed on the pixel electrode. A bank structure is disposed on the inorganic insulating layer and includes a plurality of openings respectively at least partially overlapping the pixel electrodes. A pad structure is disposed in the pad area and is electrically connected to a fan-out line disposed in the pad area and the display area. A plurality of light emitting layers are disposed on the pixel electrodes and are disposed in the openings of the bank structure. A plurality of common electrodes are disposed on the light emitting layers and are disposed in the openings of the bank structure. The bank structure includes a first bank layer and a second bank layer disposed on the first bank layer and including a metal material that is different from that of the first bank layer. The pad structure includes a first pad layer including the same material as the first bank layer, and a second pad layer disposed on the first pad layer and including the same material as the second bank layer. Each of the second bank layer and the pad layer include a tip protruding from a sidewall of the first bank layer or a sidewall of the first pad layer.

The first bank layer and the first pad layer may include aluminum (Al), and the second bank layer and the second pad layer may include titanium (Ti).

The display device may further include a plurality of dams surrounding the display area and including a plurality of stacked sub-dams including an organic insulating material, and a pad organic layer including the same material as any one of the sub-dams and disposed under the pad structure.

The first pad layer may be disposed directly on the pad organic layer, and the first pad layer may be in direct contact with the fan-out line exposed through a contact hole penetrating the pad organic layer.

The display device may further include a first sub-pad disposed in the pad area in direct contact with the fan-out line and at least partially overlapping the pad organic layer. The first pad layer may be disposed directly on the pad organic layer and may be in direct contact with the first sub-pad exposed through a contact hole penetrating the pad organic layer.

The display device may further include a first sub-pad disposed in the pad area and in direct contact with the fan-out line, and at least partially overlapping the pad organic layer, and a second sub-pad disposed on the first sub-pad and in direct contact with the first sub-pad. The first pad layer may be disposed directly on the pad organic layer and may be in direct contact with the second sub-pad, exposed through a contact hole penetrating the pad organic layer.

The inorganic insulating layer may extend to the pad area and may be disposed on the pad organic layer. The first pad layer may be disposed directly on the inorganic insulating layer.

The display device may further include a thin film encapsulation layer including a first encapsulation layer disposed on the bank structure, a second encapsulation layer disposed on the first encapsulation layer, and a third encapsulation layer disposed on the second encapsulation layer. A touch layer may be disposed on the thin film encapsulation layer and may include a plurality of touch insulating layers and a touch electrode disposed between the touch insulating layers. The pad structure may further include a third pad layer disposed on the second pad layer and disposed on the same layer as the touch electrode.

The display device may further include a light blocking layer disposed on the touch layer and at least partially overlapping the touch electrode and including a plurality of opening holes respectively at least partially overlapping the openings of the bank structure, and a plurality of color filters respectively disposed in the opening holes on the light blocking layer.

Each of the common electrodes may be in direct contact with a side surface of the first bank layer.

The display device may further include a plurality of organic patterns disposed on the second bank layer and surrounding the openings and including the same material as the light emitting layer, and a plurality of electrode patterns may be disposed on the organic patterns and may include the same material as the common electrode.

The display device may further include a plurality of inorganic layers disposed on sidewalls of the openings and disposed on the common electrodes and the electrode patterns. The inorganic layers may be different from each other and may be spaced apart from each other on the second bank layer.

The inorganic insulating layer might not be in contact with a top surface of the pixel electrode, and a part of the light emitting layer may be disposed between the pixel electrode and the inorganic insulating layer.

The display device may further include a residual pattern disposed between the pixel electrode and the inorganic insulating layer.

A display device includes a substrate including a display area and a pad area disposed on one side of the display area. A buffer layer is disposed on the substrate and is disposed in the display area and the pad area. A semiconductor layer is disposed on the buffer layer in the display area. A gate insulating layer is disposed on the semiconductor layer and is disposed in the display area and the pad area. A gate electrode is disposed on the gate insulating layer and is disposed in the display area. A fan-out line is disposed across the display area and the pad area. An interlayer insulating layer is disposed on the gate electrode and the fan-out line. A first connection electrode is disposed on the interlayer insulating layer in the display area and is connected to the semiconductor layer. A display pad portion is disposed on the interlayer insulating layer in the pad area and is connected to the fan-out line. A pad organic layer includes a passivation layer disposed on the first connection electrode in the display area. A contact hole in the display pad portion in the pad area exposes a part of a top surface of the display pad portion. A pixel electrode is disposed on the passivation layer in the display area. An inorganic insulating layer is disposed on the passivation layer and at least partially overlaps a part of the pixel electrode. A bank structure is disposed on the inorganic insulating layer in the display area and includes an opening at least partially overlapping the pixel electrode. A pad structure is disposed on the pad organic layer in the pad area and is in contact with the display pad portion. An active layer is disposed on the pixel electrode in the opening of the bank structure. A common electrode is disposed on the active layer. The bank structure includes a first bank layer and a second bank layer disposed on the first bank layer and including a metal material that is different from that of the first bank layer. The pad structure includes a first pad layer including the same material as the first bank layer. A second pad layer is disposed on the first pad layer and includes the same material as the second bank layer. Each of the second bank layer and the pad layer includes a tip protruding from a sidewall of the first bank layer or a sidewall of the first pad layer.

The display device may further include a thin film encapsulation layer including a first encapsulation layer disposed on the bank structure, a second encapsulation layer disposed on the first encapsulation layer, and a third encapsulation layer disposed on the second encapsulation layer. A touch layer is disposed on the thin film encapsulation layer and includes a plurality of touch insulating layers and a touch electrode disposed between the touch insulating layers. The pad structure may further include a third pad layer disposed on the second pad layer and disposed on the same layer as the touch electrode.

The first bank layer and the first pad layer may include aluminum (Al), and the second bank layer and the second pad layer may include titanium (Ti).

The common electrode may be in direct contact with a side surface of the first bank layer.

The inorganic insulating layer may extend to the pad area and may be disposed on the pad organic layer, and the first pad layer may be disposed directly on the inorganic insulating layer.

The display device may further include a plurality of dams surrounding the display area and including a plurality of stacked sub-dams including an organic insulating material. The pad organic layer may include the same material as any one of the sub-dams.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Embodiments of the present disclosure will now be described more fully hereinafter with reference to the accompanying drawings. This invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers may indicate the same components throughout the specification.

It will be understood that, although the terms "first," "second," etc. may be used herein to describe various elements, these elements should not necessarily be limited by these terms. These terms are used to distinguish one element from another element. For instance, a first element discussed below could be termed a second element without departing from the teachings of the invention. Similarly, the second element could also be termed the first element.

Hereinafter, embodiments will be described with reference to the accompanying drawings.

Figure 1:
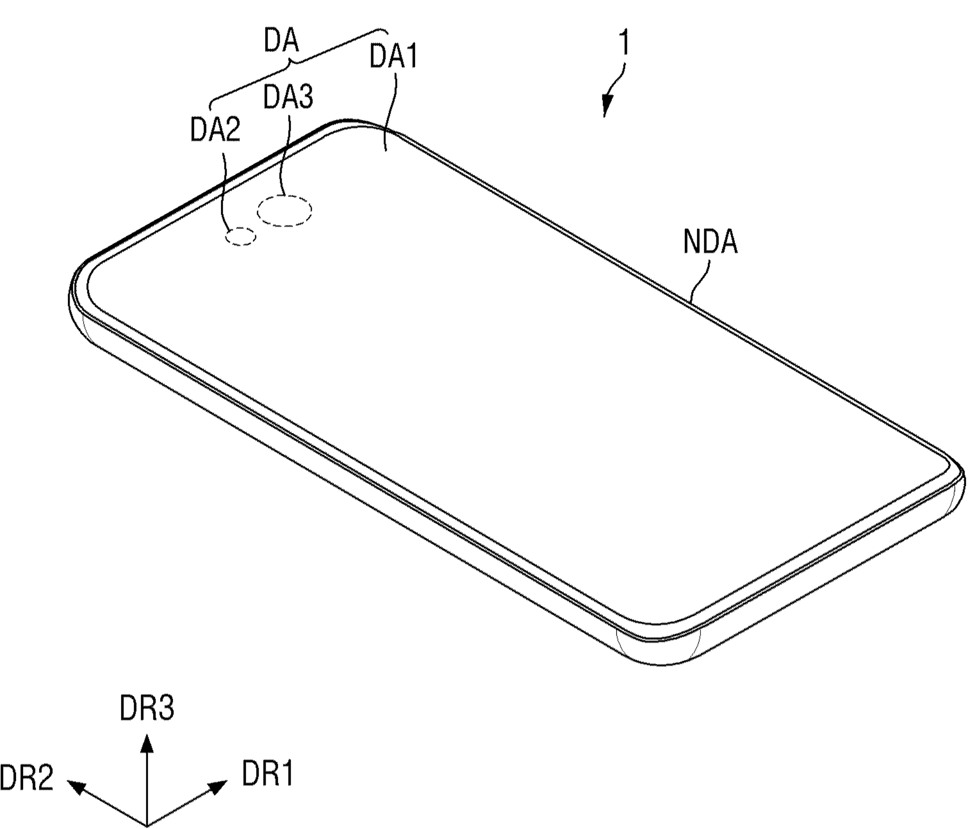
FIG. 1 is a schematic plan view of a display device according to an embodiment of the present disclosure.

FIG. 1 is a schematic plan view of a display device according to an embodiment of the present disclosure.

Referring to FIG. 1, an electronic device 1 displays a moving image (e.g., video) or a still image. The electronic device 1 may refer to any electronic device providing a display screen. Examples of the electronic device 1 may include a television, a laptop computer, a computer monitor, a digital billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game console, a digital camera, a camcorder and the like, which provide a display screen.

Figure 2:
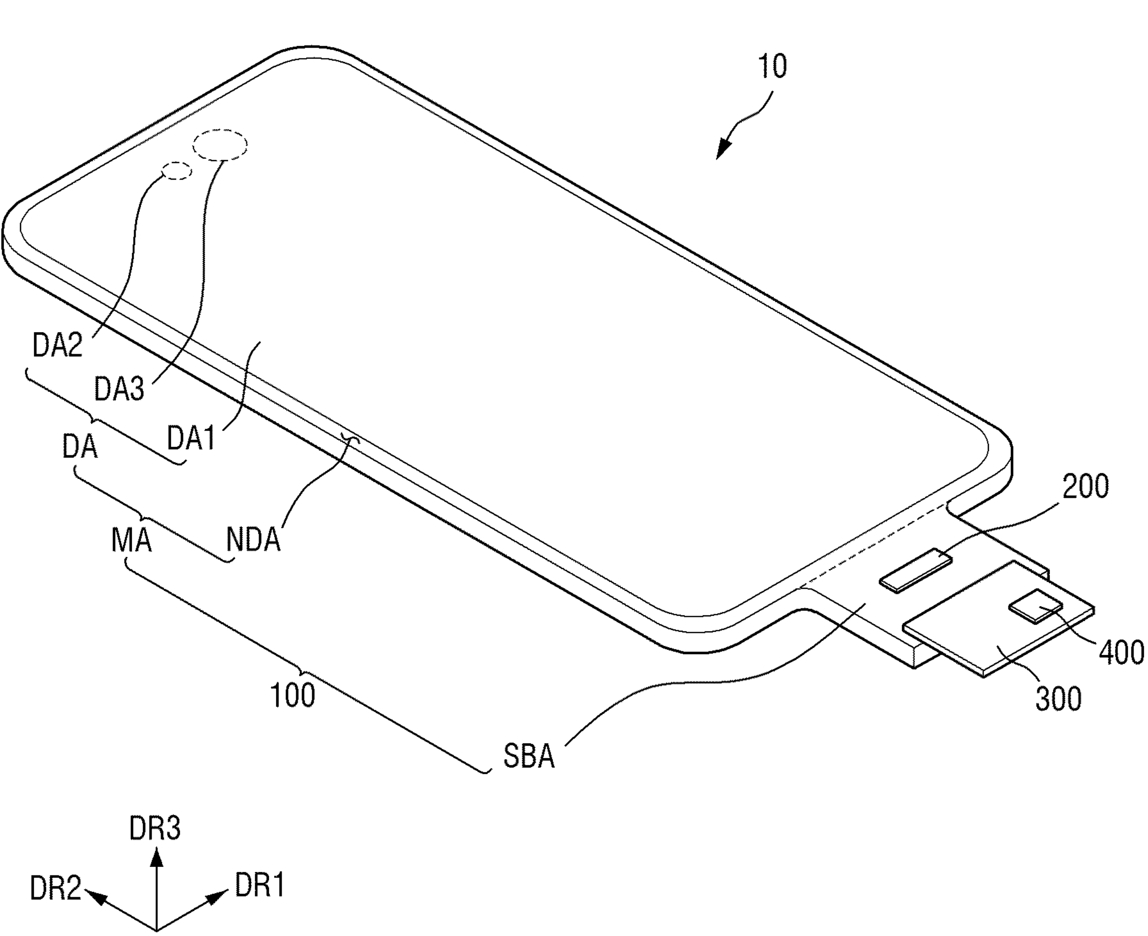
FIG. 2 is a perspective view illustrating a display device included in an electronic device according to an embodiment of the present disclosure.

The electronic device 1 may include a display device 10, as shown in FIG. 2, providing a display screen. Examples of the display device may include an inorganic light emitting diode display device, an organic light emitting diode (OLED) display device, a quantum dot light emitting display device, a plasma display device and a field emission display device. In the following description, a case where an organic light emitting diode (OLED) display device is used will be exemplified, but the disclosure is not necessarily limited thereto, and other display devices may be applied within the same scope of technical spirit.

The shape of the electronic device 1 may be variously modified. For example, the electronic device 1 may have a shape such as a rectangular shape elongated in a horizontal direction, a rectangular shape elongated in a vertical direction, a square shape, a quadrilateral shape with rounded corners (vertices), other polygonal shapes and a circular or other rounded shape. The shape of a display area DA of the electronic device 1 may also be similar to the overall shape of the electronic device 1. FIG. 1 illustrates the electronic device 1 having a rectangular shape elongated in a second direction DR2.

The electronic device 1 may include the display area DA and a non-display area NDA. The display area DA is an area where an image can be displayed, and the non-display area NDA is an area where an image is not displayed. The display area DA may also be referred to as an active region, and the non-display area NDA may also be referred to as a non-active region. The display area DA may substantially occupy the center of the electronic device 1.

The display area DA may include a first display area DA1, a second display area DA2, and a third display area DA3. The second display area DA2 and the third display area DA3 are areas in which components for adding various functions to the electronic device 1 are disposed, and the second display area DA2 and the third display area DA3 may correspond to a component area.

FIG. 2 is a perspective view illustrating a display device included in an electronic device according to an embodiment of the present disclosure.

Referring to FIG. 2, the electronic device 1, according to an embodiment of the present disclosure, may include a display device 10. The display device 10 may provide a display screen for the electronic device 1. The display device 10 may have a planar shape similar to the shape of the electronic device 1. For example, the display device 10 may have a shape similar to a rectangular shape having a pair of short sides extending in the first direction DR1 and a pair of long sides extending in the second direction DR2. The edge where the short sides extending in the first direction DR1 and the long sides extending in the second direction DR2 meet may be rounded to have a particular degree of curvature, but is not necessarily limited thereto and may be formed at a right angle. The planar shape of the display device 10 is not necessarily limited to a quadrilateral shape, and may be formed in a shape similar to another polygonal shape, a circular shape, or elliptical shape.

The display device 10 may include the display panel 100, the display driver 200, the circuit board 300, and the touch driver 400.

The display panel 100 may include a main region MA and a sub-region SBA.

The main region MA may include the display area DA including pixels displaying an image and the non-display area NDA disposed around the display area DA. The display area DA may include the first display area DA1, the second display area DA2, and the third display area DA3. The display area DA may emit light from a plurality of emission areas or a plurality of opening areas. For example, the display panel 100 may include a pixel circuit including switching elements, a pixel defining layer defining an emission area or an opening area, and a self-light emitting element.

For example, the self-light emitting element may include an organic light emitting diode (LED) including an organic light emitting layer, a quantum dot LED including a quantum dot light emitting layer, an inorganic LED including an inorganic semiconductor, or a micro LED, but is not necessarily limited thereto.

The non-display area NDA may be an area outside of the display area DA. The non-display area NDA may be defined as an edge area of the main region MA of the display panel 100. The non-display area NDA may include a gate driver that supplies gate signals to the gate lines, and fan-out lines that connect the display driver 200 to the display area DA.

The sub-region SBA may be a region extending from one side of the main region MA. The sub-region SBA may include a flexible material which can be bent, folded or rolled to a noticeable degree without cracking or otherwise sustaining damage. For example, when the sub-region SBA is bent, the sub-region SBA may at least partially overlap the main region MA in a thickness direction (third direction DR3). The sub-region SBA may include the display driver 200 and the pad portion connected to the circuit board 300. In an embodiment of the present disclosure, the sub-region SBA may be omitted, and the display driver 200 and the pad portion may be disposed in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may at least partially overlap the main region MA in the thickness direction by bending of the sub-region SBA. For example, the display driver 200 may be mounted on the circuit board 300.

The circuit board 300 may be attached to the pad portion of the display panel 100 by using an anisotropic conductive film (ACF). Lead lines of the circuit board 300 may be electrically connected to a pad portion of the display panel 100. The circuit board 300 may be a flexible printed circuit board, a printed circuit board, or a flexible film such as a chip on film.

A touch driver 400 may be mounted on the circuit board 300. The touch driver 400 may be electrically connected to a touch sensing unit of the display panel 100. The touch driver 400 may supply a touch driving signal to a plurality of touch electrodes of the touch sensing unit and may sense an amount of change in capacitance between the plurality of touch electrodes. For example, the touch driving signal may be a pulse signal having a predetermined frequency. The touch driver 400 may calculate whether an input is made and input coordinates based on an amount of change in capacitance between the plurality of touch electrodes. The touch driver 400 may include an integrated circuit (IC).

Figure 3:
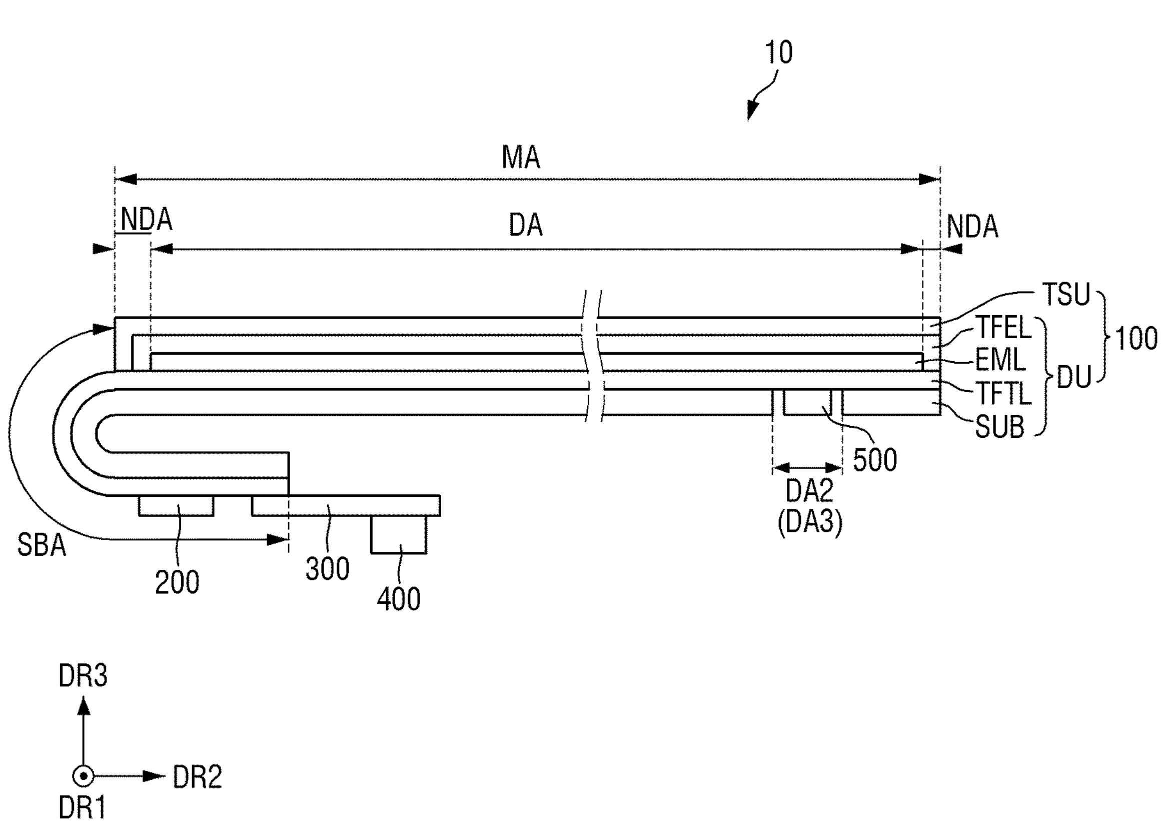
FIG. 3 is a cross-sectional view of the display device of FIG. 2 viewed from the side.

FIG. 3 is a cross-sectional view of the display device of FIG. 2 viewed from the side.

Referring to FIG. 3, the display panel 100 may include a display layer DU, a touch sensing layer TSU, and a color filter layer CFL. The display layer DU may include a substrate SUB, a thin film transistor layer TFTL, a light emitting element layer EML, and a thin film encapsulation layer TFEL.

The substrate SUB may be a base substrate or a base member. The substrate SUB may be a flexible substrate which can be bent, folded or rolled to a noticeable extent without cracking or otherwise sustaining damage. For example, the substrate SUB may include a polymer resin such as polyimide (PI), but is not necessarily limited thereto. In an embodiment of the present disclosure, the substrate SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad portion. Each of the thin film transistors may include a semiconductor region, a source electrode, a drain electrode, and a gate electrode. For example, when the gate driver is formed on one side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements each including a first electrode, a second electrode, and a light emitting layer that emits light, and a pixel defining layer defining pixels. The plurality of light emitting elements of the light emitting element layer EML may be disposed in the display area DA.

In an embodiment of the present disclosure, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer.

In an embodiment of the present disclosure, the light emitting elements may include a quantum dot light emitting diode including a quantum dot light emitting layer, an inorganic light emitting diode including an inorganic semiconductor, or a micro light emitting diode.

The display device 10, according to an embodiment of the present disclosure, may include a plurality of color filters CF1, CF2, and CF3 (see FIGS. 5 and 6) disposed on the light emitting elements of the light emitting element layer EML. Each of the color filters may selectively transmit light of a specific wavelength and may block or absorb light of a other wavelengths. The color filters may absorb a part of the ambient light coming from the outside of the display device 10 to reduce reflected ambient light. Accordingly, the color filter may prevent color distortion caused by reflection of the ambient light.

Since the color filters are disposed on the light emitting elements, the display device 10 might not require a separate substrate for the color filter. Accordingly, the thickness of the display device 10 may be relatively small.

The thin film encapsulation layer TFEL may cover the top surface and the side surface of the light emitting element layer EML, and may protect the light emitting element layer EML. The thin film encapsulation layer TFEL may include at least one inorganic layer and at least one organic layer for encapsulating the light emitting element layer EML.

The touch sensing layer TSU may be disposed on the encapsulation layer TFEL. The touch sensing layer TSU may include a plurality of touch electrodes for sensing a user's touch in a capacitive manner, and touch lines connecting the plurality of touch electrodes to the touch driver 400. For example, the touch sensing layer TSU may sense the user's touch by using a mutual capacitance method or a self-capacitance method.

In an embodiment of the present disclosure, the touch sensing layer TSU may be disposed on a separate substrate disposed on the display layer DU. In this case, the substrate supporting the touch sensing layer TSU may be a base member that encapsulates the display layer DU.

The plurality of touch electrodes of the touch sensing layer TSU may be disposed in a touch sensor area at least partially overlapping the display area DA. The touch lines of the touch sensing layer TSU may be disposed in a touch peripheral area that at least partially overlaps the non-display area NDA.

In some embodiments, the display device 10 may further include an optical device 500. The optical device 500 may be disposed in the second display area DA2 or the third display area DA3. The optical device 500 may emit or receive light in infrared, ultraviolet, and visible light bands. For example, the optical device 500 may be an optical sensor that detects light incident on the display device 10 such as a proximity sensor, an illuminance sensor, and a camera sensor or an image sensor.

The color filter layer CFL may be disposed on the thin film encapsulation layer TFEL. The color filter layer CFL may include a plurality of color filters respectively corresponding to the plurality of emission areas. Each of the color filters may selectively transmit light of a specific wavelength and may block or absorb light of other wavelengths. The color filter layer CFL may absorb a part of ambient light coming from the outside of the display device 10 to reduce reflected ambient light. Accordingly, the color filter layer CFL may prevent color distortion caused by reflection of the ambient light.

Since the color filter layer CFL is disposed directly on the thin film encapsulation layer TFEL, the display device 10 might not require a separate substrate for the color filter layer CFL. Accordingly, the thickness of the display device 10 may be relatively small.

Figure 4:
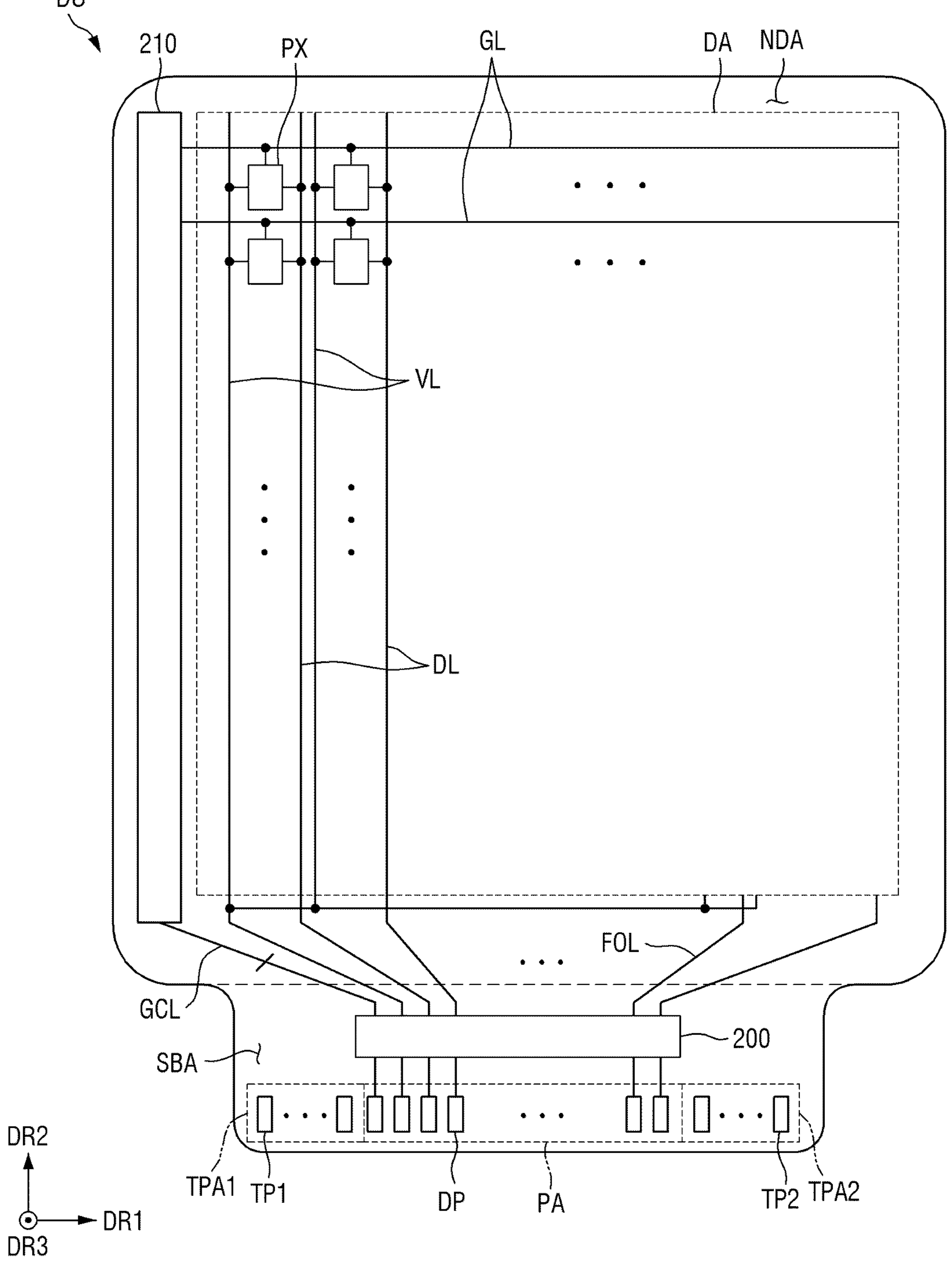
FIG. 4 is a plan view illustrating a display layer of a display device according to an embodiment of the present disclosure.

FIG. 4 is a plan view illustrating a display layer of a display device according to an embodiment of the present disclosure.

Referring to FIG. 4, the display layer DU may include the display area DA and the non-display area NDA.

The display area DA may be disposed at the center of the display panel 100. A plurality of pixels PX, a plurality of gate lines GL, a plurality of data lines DL, and a plurality of power lines VL may be disposed in the display area DA. Each of the plurality of pixels PX may be defined as a minimum unit that emits light.

The plurality of gate lines GL may supply the gate signals received from a gate driver 210 to the plurality of pixels PX. The plurality of gate lines GL may extend in the first direction DR1 and may be spaced apart from each other in the second direction DR2 intersecting the first direction DR1.

The plurality of data lines DL may supply the data voltages received from the display driver 200 to the plurality of pixels PX. The plurality of data lines DL may extend in the second direction DR2 and may be spaced apart from each other in the first direction DR1.

The plurality of power lines VL may supply the power voltage received from the display driver 200 to the plurality of pixels PX. Here, the power voltage may be a driving voltage, an initialization voltage, a reference voltage, and/or a low potential voltage. The plurality of power lines VL may extend in the second direction DR2 and may be spaced apart from each other in the first direction DR1.

The non-display area NDA may at least partially surround the display area DA. A gate driver 210, fan-out lines FOL, and gate control lines GCL may be disposed in the non-display area NDA. The gate driver 210 may generate a plurality of gate signals based on the gate control signal, and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels PX, and the luminance of the plurality of pixels PX may be controlled. The display driver 200 may supply the gate control signal to the gate driver 210 through the gate control line GCL.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a material such as self assembly anisotropic conductive paste (SAP) or an anisotropic conductive film.

The pad area PA may include a plurality of display pad portions DP. The plurality of display pad portions DP may be connected to a graphic system through the circuit board 300. The plurality of display pad portions DP may be connected to the circuit board 300 to receive digital video data, and may supply the digital video data to the display driver 200.

Figure 5:
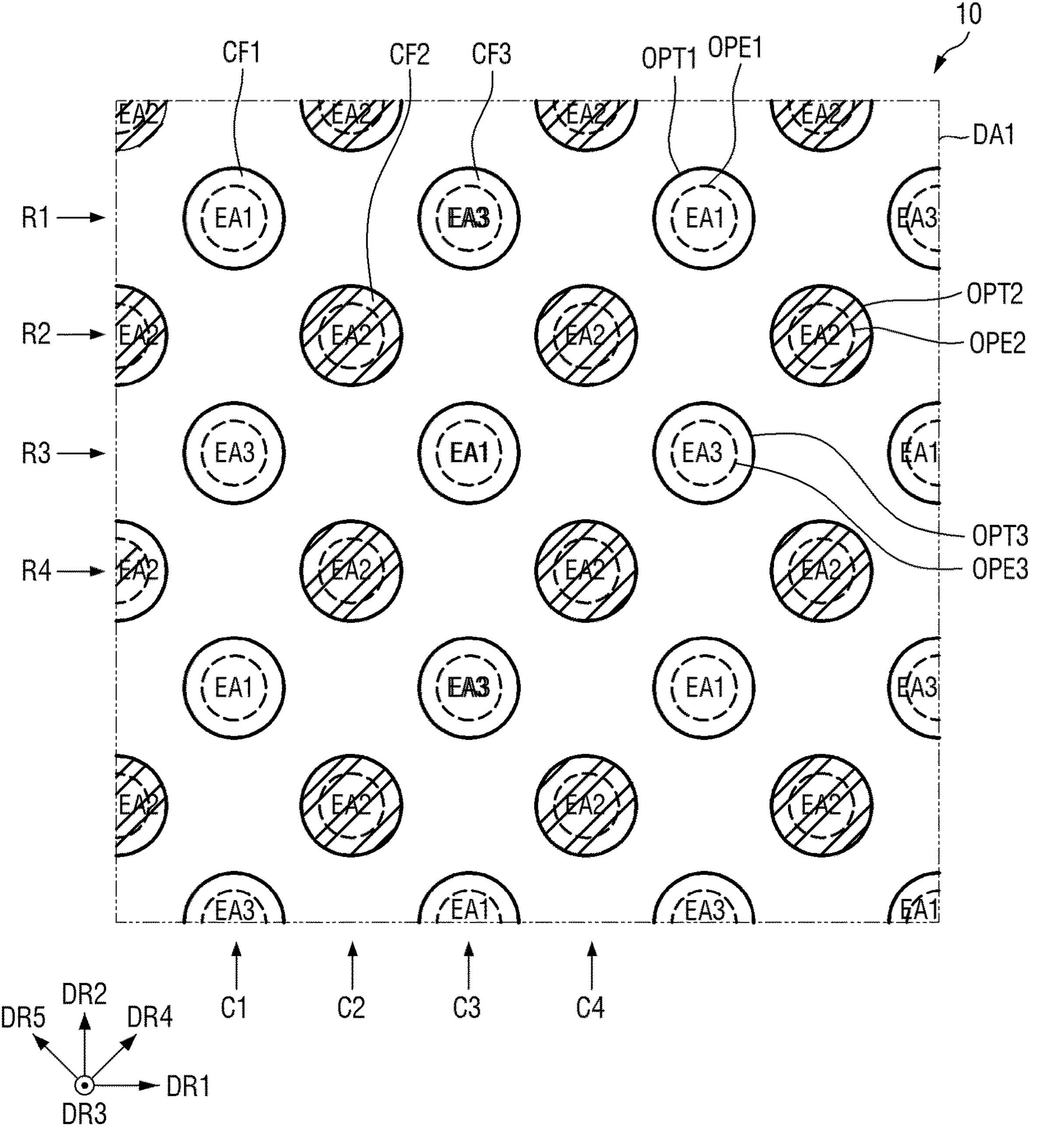
FIG. 5 is a plan view of the disposition of the color filters and the emission areas in the display area of the display device according to an embodiment of the present disclosure.

FIG. 5 is a plan view of the disposition of the color filters and the emission areas in the display area of the display device according to an embodiment of the present disclosure.

Referring to FIG. 5, the display device 10 may include a plurality of emission areas EA1, EA2, and EA3 disposed in the display area DA. The display area DA shown in FIG. 5 is the first display area DA1, and the plurality of emission areas EA1, EA2, and EA3 may be disposed in the first display area DA1. However, the plurality of emission areas EA1, EA2, and EA3 may be disposed also in the second display area DA2 and the third display area DA3 of the display area DA.

The emission areas EA1, EA2, and EA3 may include a first emission area EA1, a second emission area EA2, and a third emission area EA3, emitting light of different colors. The first to third emission areas EA1, EA2, and EA3 may emit red, green, or blue light, respectively, and the color of the light emitted from each of the emission areas EA1, EA2 and EA3 may be different depending on the type of light emitting elements ED1, ED2, and ED3 (see FIG. 6) disposed on a light emitting element layer EML to be described later. In an embodiment of the present disclosure, the first emission area EA1 may emit first light of a red color, the second emission area EA2 may emit second light of a green color, and the third emission area EA3 may emit third light of a blue color. However, the disclosure is not necessarily limited thereto.

The plurality of emission areas EA1, EA2, and EA3 may be arranged in a PENTILE™ type, e.g., a diamond PENTILE™ type, where PENTILE™ is an arrangement of luminous areas manufactured by SAMSUNG. For example, the first emission area EA1 and the third emission area EA3 may be spaced apart from each other in the first direction DR1, and they may be alternately disposed in the first direction DR1 and the second direction DR2. In the arrangement of the emission areas EA1, EA2, and EA3, the first emission area EA1 and the third emission area EA3 may be alternately disposed in the first direction DR1 in a first row R1 and a third row R3. In a first column C1 and a third column C3, the first emission area EA1 and the third emission area EA3 may be alternately disposed in the second direction DR2.

The second emission area EA2 may be spaced apart from another adjacent second emission area EA2 in the first direction DR1 and the second direction DR2, and may be spaced apart from an adjacent first emission area EA1 and an adjacent third emission area EA3 in a fourth direction DR4 or a fifth direction DR5. The plurality of second emission areas EA2 may be repeatedly disposed along the first direction DR1 and the second direction DR2, and the second emission area EA2 and the first emission area EA1, or the second emission area EA2 and the third emission area EA3 may be alternately disposed along the fourth direction DR4 or the fifth direction DR5. In the arrangement of the emission areas EA1, EA2, and EA3, the second emission area EA2 may be repeatedly disposed in the first direction DR1 in a second row R2 and a fourth row R4, and the second emission area EA2 may be repeatedly disposed in the second direction DR2 in a second column C2 and a fourth column C4.

The first to third emission areas EA1, EA2, and EA3 may be respectively defined by a plurality of openings OPE1, OPE2, and OPE3 formed in a bank structure BNS (see FIG. 6) of the light emitting element layer EML which will be described later. For example, the first emission area EA1 may be defined by the first opening OPE1 of the pixel defining layer, the second emission area EA2 may be defined by the second opening OPE2 of the pixel defining layer, and the third emission area EA3 may be defined by the third opening OPE3 of the pixel defining layer.

Figure 6:
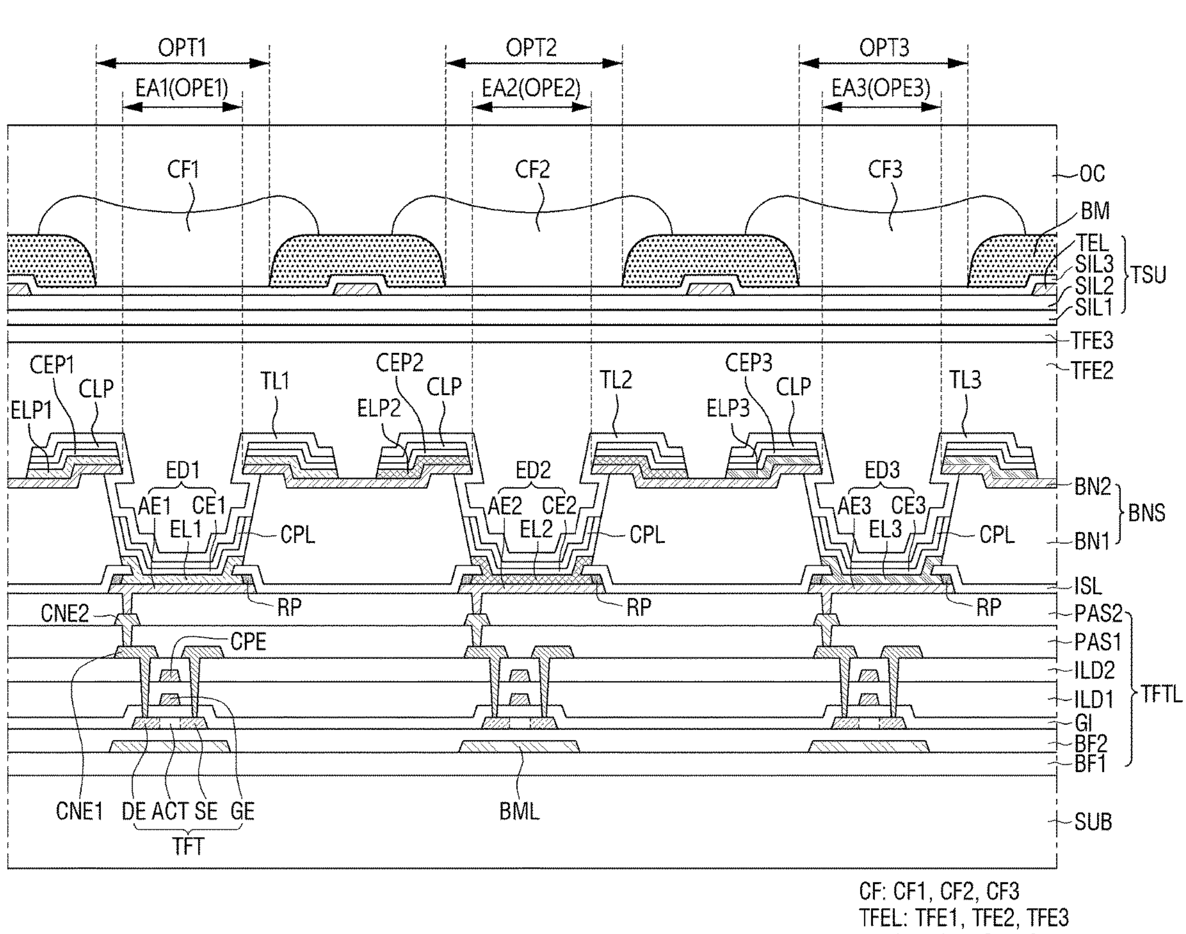
FIG. 6 is a cross-sectional view illustrating a part of a display device according to an embodiment of the present disclosure.

The areas of the emission areas EA1, EA2, and EA3 may vary according to the sizes of the openings OPE1, OPE2, and OPE3 of the bank structure. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. In an embodiment of the present disclosure, the areas or sizes of the first to third emission areas EA1, EA2, and EA3 may be the same. In the embodiment of FIG. 6, the first emission area EA1, the second emission area EA2, and the third emission area EA3 may have the same area and/or the same diameter.

However, the disclosure is not necessarily limited thereto. The areas of the emission areas EA1, EA2, and EA3 may be freely adjusted according to the color of the screen required by the display device 10 and the electronic device 1. In addition, the areas of the emission areas EA1, EA2, and EA3 may be related to light efficiency and the lifespan of the light emitting element ED, and may have a trade-off relation with the reflection by external light. The areas of the emission areas EA1, EA2, and EA3 may be adjusted in consideration of the above factors. For example, in the display device 10, the area of the third emission area EA3 may be greater than the areas of the first emission area EA1 and the second emission area EA2, and the area of the first emission area EA1 may be greater than the area of the second emission area EA2.

In the display device 10 having the arrangement of the emission areas EA1, EA2, and EA3 shown in FIG. 5, one first emission area EA1, two second emission areas EA2, and one third emission area EA3 adjacent to each other may form one pixel group. One pixel group may include the emission areas EA1, EA2, and EA3 emitting light of different colors to express a gray scale for each of a set of primary colors that combine to form a full color gamut. However, the disclosure is not necessarily limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the plurality of color filters CF1, CF2, and CF3 disposed on the emission areas EA1, EA2, and EA3. The plurality of color filters CF1, CF2, and CF3 may correspond to the emission areas EA1, EA2, and EA3, respectively. For example, the color filters CF1, CF2, and CF3 may be disposed in the emission areas EA1, EA2, and EA3, or a plurality of opening holes OPT1, OPT2, and OPT3 of a light blocking layer BM corresponding to the openings OPE1, OPE2, and OPE3, respectively. The opening holes OPT1, OPT2, and OPT3 of the light blocking layer may at least partially overlap the openings OPE1, OPE2, and OPE3, and a light exit area from which the light emitted from the emission areas EA1, EA2, and EA3 is emitted may be formed. The color filters CF1, CF2, and CF3 may have areas greater than those of the openings OPE1, OPE2, and OPE3, respectively, and the color filters CF1, CF2, and CF3 may completely cover the light exit area formed by the opening holes OPT1, OPT2, and OPT3 of the light blocking layer BM, respectively.

The color filters CF1, CF2, and CF3 may include a first color filter CF1, a second color filter CF2, and a third color filter CF3 corresponding to the different emission areas EA1, EA2, and EA3, respectively. The color filters CF1, CF2, and CF3 may include a colorant such as a dye or a pigment that absorbs light in a wavelength band other than light in a specific wavelength band, and may correspond to the color of the light emitted from the emission areas EA1, EA2, and EA3. For example, the first color filter CF1 may be a red color filter that at least partially overlaps the first emission area EA1 and transmits only the first light of the red color. The second color filter CF2 may be a green color filter that at least partially overlaps the second emission area EA2 and transmits only the second light of the green color, and the third color filter CF3 may be a blue color filter that at least partially overlaps the third emission area EA3 and transmits only the third light of the blue color.

Similarly to the arrangement of the emission areas EA1, EA2, and EA3, the color filters CF1, CF2, and CF3 may be arranged in a PENTILE™ type, e.g., a diamond PENTILE™ type. For example, the first color filter CF1 and the third color filter CF3 may be alternately disposed in the first direction DR1 and the second direction DR2. In the arrangement of the color filters CF1, CF2, and CF3, the first color filter CF1 and the third color filter CF3 may be alternately disposed in the first direction DR1 in the first row R1 and the third row R3. In the first column C1 and the third column C3, the first color filter CF1 and the third color filter CF3 may be alternately disposed in the second direction DR2.

The second color filter CF2 and another adjacent second color filter CF2 may be disposed in the first direction DR1 and the second direction DR2, and the second color filter CF2 and an adjacent first color filter CF1 and an adjacent third color filter CF3 may be disposed in the fourth direction DR4 or the fifth direction DR5. The plurality of second color filters CF2 may be repeatedly disposed along the first direction DR1 and the second direction DR2, and the second color filter CF2 and the first color filter CF1, or the second color filter CF2 and the third color filter CF3 may be alternately disposed along the fourth direction DR4 or the fifth direction DR5. In the arrangement of the color filters CF1, CF2, and CF3, the second color filter CF2 may be repeatedly disposed in the first direction DR1 in the second row R2 and the fourth row R4, and the second color filter CF2 may be repeatedly disposed in the second direction DR2 in the column C2 and the fourth column C4.

Figure 7:
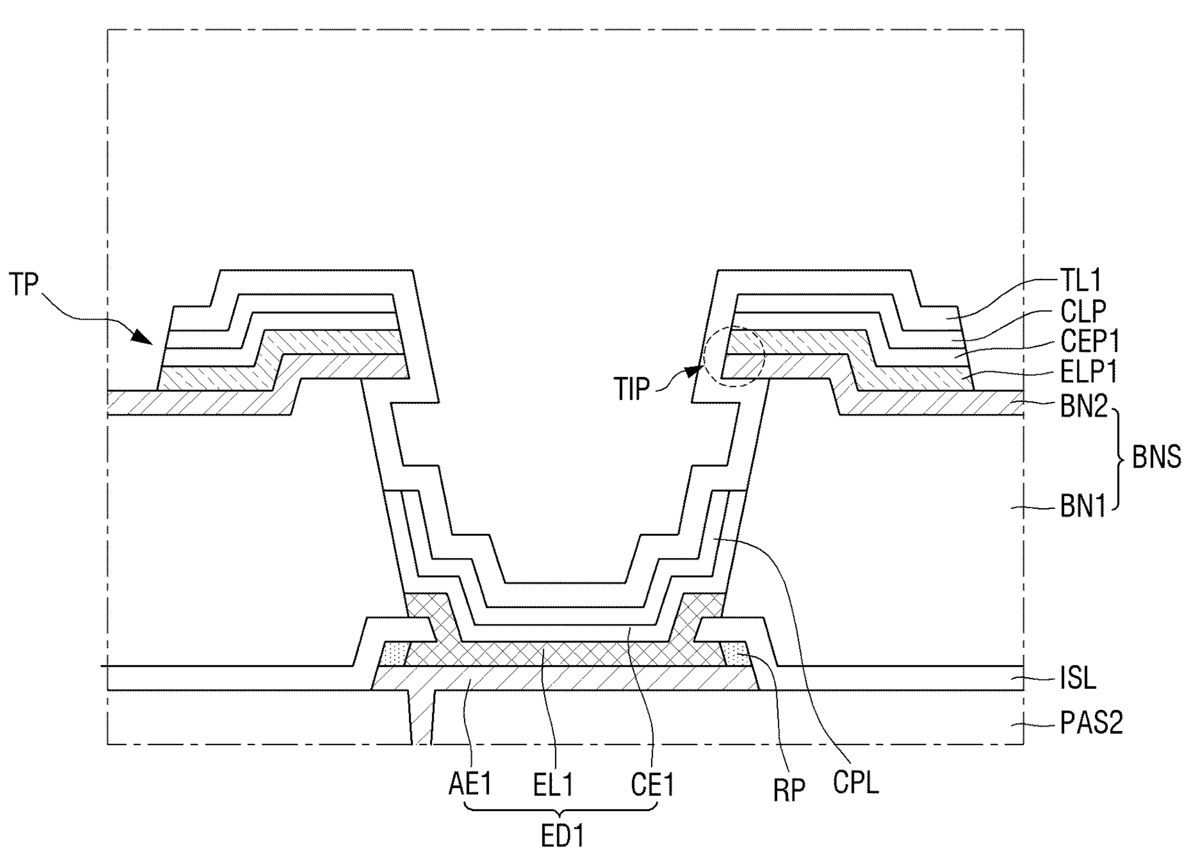
FIG. 7 is an enlarged view illustrating the first emission area of FIG. 6.

FIG. 6 is a cross-sectional view illustrating a part of a display device according to an embodiment of the present disclosure. FIG. 7 is an enlarged view illustrating the first emission area of FIG. 6. FIG. 6, which is a partial cross-sectional view of the display device 10, illustrates the cross section of the substrate SUB, the thin film transistor layer TFTL, the light emitting element layer EML, and the thin film encapsulation layer TFEL of the display layer DU, the touch sensing layer TSU, and the color filter layer CFL. FIG. 7 illustrates a first light emitting element ED1 disposed in the first emission area EA1 in FIG. 6 and a part of the bank structure BNS adjacent thereto.

Referring to FIGS. 6 and 7 in addition to FIG. 5, the display panel 100 of the display device 10 may include the display layer DU. The display layer DU may include a substrate SUB, a thin film transistor layer TFTL, a light emitting element layer EML, and a thin film encapsulation layer TFEL. The display panel 100 may include the light blocking layer BM disposed on the thin film encapsulation layer TFEL, and the color filters CF1, CF2, and CF3 of the color filter layer CFL may be disposed on the light blocking layer BM.

The substrate SUB may be a base substrate or a base member. The substrate SUB may be a flexible substrate which can be bent, folded or rolled to a noticeable extent without cracking or otherwise sustaining damage. For example, the substrate SUB may include a polymer resin such as polyimide (PI), but is not necessarily limited thereto. For example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include a plurality of inorganic layers that are alternately stacked.

The lower metal layer BML may be disposed on the first buffer layer BF1. For example, the lower metal layer BML may be formed as a single layer or multiple layers made of molybdenum (Mo), aluminum (Al), chromium (Cr), gold (Au), titanium (Ti), nickel (Ni), neodymium (Nd) and/or copper (Cu) or an alloy thereof.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include a plurality of inorganic layers that are alternately stacked.

The thin film transistor TFT may be disposed on the second buffer layer BF2, and may constitute a pixel circuit of each of a plurality of pixels. For example, the thin film transistor TFT may be a switching transistor or a driving transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may at least partially overlap the lower metal layer BML and the gate electrode GE in the thickness direction, and may be insulated from the gate electrode GE by the gate insulating layer GI. In a part of the semiconductor layer ACT, a material of the semiconductor layer ACT may be made into a conductor to form the source electrode SE and the drain electrode DE.

The gate electrode GE may be disposed on the gate insulating layer GI. The gate electrode GE may at least partially overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF to insulate the gate electrode GE from the semiconductor layer ACT. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may at least partially overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT to the second connection electrode CNE2. The first connection electrode CNE1 may be inserted into a contact hole provided in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to pixel electrodes AE1, AE2, and AE3 of the light emitting element ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrodes AE1, AE2, and AE3 of the light emitting element ED pass.

The light emitting element layer EML may be disposed on the thin film transistor layer TFTL. The light emitting element layer EML may include the light emitting element ED and the plurality of bank structures BNS. The light emitting element ED may include the pixel electrodes AE1, AE2, and AE3, light emitting layers EL1, EL2, and EL3, and common electrodes CE1, CE2, and CE3.

The display device 10 may include the plurality of emission areas EA1, EA2, and EA3 disposed in the display area DA. The emission areas EA1, EA2, and EA3 may include a first emission area EA1, a second emission area EA2, and a third emission area EA3 emitting light of different colors. The first to third emission areas EA1, EA2, and EA3 may emit red, green, or blue light, respectively, and the color of the light emitted from each of the emission areas EA1, EA2 and EA3 may be different depending on the type of the light emitting element ED disposed on the light emitting element layer EML. In an embodiment of the present disclosure, the first emission area EA1 may emit first light of a red color, the second emission area EA2 may emit second light of a green color, and the third emission area EA3 may emit third light of a blue color. However, the disclosure is not necessarily limited thereto.

The first to third emission areas EA1, EA2, and EA3 may be defined by a plurality of openings OPE1, OPE2, and OPE3 formed in the bank structure BNS of the light emitting element layer EML, respectively. For example, the first emission area EA1 may be defined by the first opening OPE1 of the bank structure BNS, the second emission area EA2 may be defined by the second opening OPE2 of the bank structure BNS, and the third emission area EA3 may be defined by the third opening OPE3 of the bank structure BNS.

In an embodiment of the present disclosure, the areas and/or sizes of the first to third emission areas EA1, EA2, and EA3 may be the same. For example, in the display device 10, the openings OPE1, OPE2, and OPE3 of the bank structures BNS may have the same diameter, and the first emission area EA1, the second emission area EA2, and the third emission area EA3 may have the same area. However, the disclosure is not necessarily limited thereto. In the display device 10, the areas or sizes of the first to third emission areas EA1, EA2, and EA3 may be different from each other. For example, the areas of the second emission area EA2 may be greater than the areas of the first emission area EA1 and the third emission area EA3, and the area of the third emission area EA3 may be greater than the area of the first emission area EA1. The intensity of light emitted from the corresponding emission areas EA1, EA2, and EA3 may vary according to the areas of the emission areas EA1, EA2, and EA3, and the areas of the emission areas EA1, EA2, and EA3 may be adjusted to control the color of the screen displayed on the display device 10 or the electronic device 1. Although it is illustrated in the embodiment of FIG. 5 that the emission areas EA1, EA2, and EA3 have the same area, the disclosure is not necessarily limited thereto. The areas of the emission areas EA1, EA2, and EA3 may be freely adjusted according to the color of the screen required by the display device 10 and the electronic device 1. In addition, the areas of the emission areas EA1, EA2, and EA3 may be related to light efficiency and the lifespan of the light emitting element ED, and may have a trade-off relation with the reflection by external light. The areas of the emission areas EA1, EA2, and EA3 may be adjusted in consideration of the above factors.

In the display device 10, one first emission area EA1, one second emission area EA2, and one third emission area EA3 disposed adjacent to each other may form one pixel group. One pixel group may include the emission areas EA1, EA2, and EA3 emitting light of different colors to express a gray scale for each of a set of primary colors that combine to form a full color gamut. However, the disclosure is not necessarily limited thereto, and the combination of the emission areas EA1, EA2, and EA3 constituting one pixel group may be variously modified depending on the arrangement of the emission areas EA1, EA2, and EA3, the color of the light emitted from the emission areas EA1, EA2, and EA3, and the like.

The display device 10 may include the plurality of light emitting elements ED1, ED2, and ED3 disposed in the different emission areas EA1, EA2, and EA3. The light emitting elements ED1, ED2, and ED3 may include a first light emitting element ED1 disposed in the first emission area EA1, a second light emitting element ED2 disposed in the second emission area EA2, and a third light emitting element ED3 disposed in the third emission area EA3. The light emitting elements ED1, ED2, and ED3 may include the pixel electrodes AE1, AE2, and AE3, the light emitting layers EL1, EL2, and EL3, and the common electrodes CE1, CE2, and CE3, respectively, and the light emitting layers EL1, EL2, and EL3 disposed in the different emission areas EA1, EA2, and EA3 may emit light of different colors depending on the materials of the light emitting layers EL1, EL2, and EL3. For example, the first light emitting element ED1 disposed in the first emission area EA1 may emit red light of a first color, the second light emitting element ED2 disposed in the second emission area EA2 may emit green light of a second color, and the third light emitting element ED3 disposed in the third emission area EA3 may emit blue light of a third color. The first to third emission areas EA1, EA2, and EA3 constituting one pixel may respectively include the light emitting elements ED1, ED2, and ED3 emitting light of different colors to express a gray scale for each of a set of primary colors that combine to form a full color gamut.

The pixel electrodes AE1, AE2, and AE3 may be disposed on the second passivation layer PAS2. The pixel electrodes AE1, AE2, and AE3 may at least partially overlap the openings OPE1, OPE2, and/or OPE3 of the bank structure BNS. The pixel electrodes AE1, AE2, and AE3 may be electrically connected to the drain electrode DE of the thin film transistor TFT through the first and second connection electrodes CNE1 and CNE2.

The pixel electrodes AE1, AE2, and AE3 may be disposed in the plurality of emission areas EA1, EA2, and EA3, respectively. The pixel electrodes AE1, AE2, and AE3 may include a first pixel electrode AE1 disposed in the first emission area EA1, a second pixel electrode AE2 disposed in the second emission area EA2, and a third pixel electrode AE3 disposed in the third emission area EA3. The first pixel electrode AE1, the second pixel electrode AE2, and the third pixel electrode AE3 may be spaced apart from each other on the second passivation layer PAS2. The pixel electrodes AE1, AE2, and AE3 may be disposed in the different emission areas EA1, EA2, and EA3 to constitute the light emitting elements ED1, ED2, and ED3 emitting light of different colors, respectively.

An inorganic insulating layer ISL may be disposed on the second passivation layer PAS2 and the pixel electrodes AE1, AE2, and AE3. The inorganic insulating layer ISL may be disposed on the entire second passivation layer PAS2, and may partially overlap the pixel electrodes AE1, AE2, and AE3 and expose a part of the top surface of each of the pixel electrodes AE1, AE2, and AE3. The inorganic insulating layer ISL may expose the pixel electrodes AE1, AE2, and AE3 at the portions overlapping the openings OPE1, OPE2, and OPE3 of the bank structure BNS, and the light emitting layers EL1, EL2, and EL3 disposed on the pixel electrodes AE1, AE2, and AE3 may be disposed directly on the pixel electrodes AE1, AE2, and AE3, respectively. The inorganic insulating layer ISL may include an inorganic insulating material. For example, the inorganic insulating layer ISL may include aluminum oxide, titanium oxide, tantalum oxide, hafnium oxide, zinc oxide, silicon oxide, silicon nitride, and/or silicon oxynitride.

In accordance with an embodiment of the present disclosure, the inorganic insulating layer ISL may be disposed on the pixel electrodes AE1, AE2, and AE3, and may be spaced apart from the top surfaces of the pixel electrodes AE1, AE2, and AE3. The inorganic insulating layer ISL may partially overlap the pixel electrodes AE1, AE2, and AE3 without direct contact, and the light emitting layers EL1, EL2, and EL3 of the light emitting elements ED1, ED2, and ED3 may be partially disposed between the inorganic insulating layer ISL and the pixel electrodes AE1, AE2, and AE3. In the manufacturing process of the display device 10, a sacrificial layer SFL (see FIG. 9) may be disposed on the pixel electrodes AE1, AE2, and AE3 before the inorganic insulating layer ISL is formed. The inorganic insulating layer ISL may cover a part of the sacrificial layer, and may be spaced apart from the top surfaces of the pixel electrodes AE1, AE2, and AE3 by the removal of the sacrificial layer. Then, in the deposition process of the light emitting layers EL1, EL2, and EL3, the materials forming the light emitting layers EL1, EL2, and EL3 may fill the space between the inorganic insulating layer ISL and the pixel electrodes AE1, AE2, and AE3, and the inorganic insulating layer ISL may be partially disposed on the light emitting layers EL1, EL2, and EL3. However, the inorganic insulating layer ISL may be in direct contact with the side surfaces of the pixel electrodes AE1, AE2, and AE3.

The display device 10 may include the plurality of bank structures BNS disposed on the thin film transistor layer TFTL or the substrate SUB and including the plurality of openings OPE1, OPE2, and OPE3. The bank structure BNS may have a structure in which bank layers BN1 and BN2 including different materials are sequentially stacked, and may include the plurality of openings OPE1, OPE2, and OPE3 respectively forming the emission areas EA1, EA2, and EA3. The light emitting elements ED1, ED2, and ED3 of the display device 10 may at least partially overlap the openings OPE1, OPE2, and OPE3 of the bank structure BNS.

The bank structure BNS may include the first bank layer BN1 disposed on the inorganic insulating layer ISL, and the second bank layer BN2 disposed on the first bank layer BN1.

In accordance with an embodiment of the present disclosure, the first bank layer BN1 and the second bank layer BN2 may include different metal materials, and the bank structure BNS may include a tip TIP in which the second bank layer BN2 protrudes from the first bank layer BN1 toward the openings OPE1, OPE2, and OPE3. In the bank structure BNS, the lateral side of the first bank layer BN1 may have a shape recessed inward from the lateral side of the second bank layer BN2. In the bank structure BNS, the first bank layer BN1 may be thicker than the second bank layer BN2, and the second bank layer BN2 may be relatively thin so that the tip TIP may be formed in the manufacturing process. Since the second bank layer BN2 has a shape protruding toward the openings OPE1, OPE2, and OPE3 more than the first bank layer BN1, an undercut may be formed under the tip TIP of the second bank layer BN2 on the inner sidewalls of the openings OPE1, OPE2, and OPE3 of the bank structure BNS.

The sidewall shape of the bank structure BNS may be a structure formed by a difference in etching rates in an etching process due to different materials of the first bank layer BN1 and the second bank layer BN2. In accordance with an embodiment of the present disclosure, the second bank layer BN2 may include a material having an etching rate that is lower than that of the first bank layer BN1, and the first bank layer BN1 may be further etched in the process of forming the openings OPE1, OPE2, and OPE3 of the bank structure BNS to form the undercut under the tip TIP of the second bank layer BN2. In an embodiment of the present disclosure, the first bank layer BN1 may include a metal material having high electrical conductivity, and the second bank layer BN2 may include a metal material having low reflectivity of light. For example, the first bank layer BN1 may include aluminum (Al), and the second bank layer BN2 may include titanium (Ti). The bank structure BNS may have a structure in which Al/Ti layers are stacked on the inorganic insulating layer ISL, and the tip TIP may be formed in the Ti layer of the second bank layer BN2.

The bank structure BNS may include the openings OPE1, OPE2, and OPE3 respectively forming the emission areas EA1, EA2, and EA3, and the light blocking layer BM may be disposed thereon. The uppermost layer of the bank structure BNS may include a material having low reflectivity of light to reduce reflection of ambient light. Further, in the bank structure BNS, the first bank layer BN1 may be electrically connected to the common electrodes CE1, CE2, and CE3 of the different light emitting elements ED1, ED2, and ED3. In the light emitting elements ED1, ED2, and ED3 disposed in the different emission areas EA1, EA2, and EA3, the common electrodes CE1, CE2, and CE3 are not directly connected, but may be electrically connected through the first bank layer BN1.

In the manufacturing process of the display device 10, a mask process is used to form the pixel defining layer forming the emission areas EA1, EA2, and EA3 using an organic material, or to form the light emitting layers EL1, EL2, and EL3 of the light emitting elements ED1, ED2 and ED3 in the respective emission areas EA1, EA2, and EA3. In order to perform the mask process, the display device 10 may utilize a structure for mounting a mask, or an unnecessarily large area of the non-display area NDA may be used to control variation according to the mask process. If such a mask process is minimized, an unnecessary component, e.g., the structure for mounting a mask, may be omitted in the display device 10, and the area of the non-display area NDA for controlling variation may be minimized.

The display device 10, according to an embodiment of the present disclosure, includes the bank structure BNS forming the emission areas EA1, EA2, and EA3, and this may be formed by a deposition and etching process instead of the mask process. Further, the bank structure BNS includes the first bank layer BN1 and the second bank layer BN2 including different metal materials and have a structure including the tip TIP on the inner sidewalls of the openings OPE1, OPE2, and OPE3, so that it is possible to separately form different layers in the different emission areas EA1, EA2, and EA3 even by a deposition process. For example, even when the light emitting layers EL1, EL2, and EL3 of the light emitting elements ED1, ED2, and ED3 and the common electrodes CE1, CE2, and CE3 are formed by a deposition process using no mask, the deposited materials may be disconnected without being connected between the openings OPE1, OPE2, and OPE3 by the tip TIP of the second bank layer BN2 formed on the inner sidewalls of the openings OPE1, OPE2, and OPE3. By a process of forming a material for forming a specific layer on the entire surface of the display device 10 and then removing the layer formed in an undesired region by etching, it is possible to individually form different layers in the different emission areas EA1, EA2, and EA3. In the display device 10, the different light emitting elements ED1, ED2, and ED3 may be formed in the different emission areas EA1, EA2, and EA3 by the deposition and etching process without using the mask process, and an unnecessary component in the display device 10 may be omitted to minimize the area of the non-display area NDA.

The first encapsulation layer TFE1 of the thin film encapsulation layer TFEL may be disposed on the common electrodes CE1, CE2, and CE3 of the light emitting elements ED1, ED2, and ED3. The first encapsulation layer TFE1 may include a first inorganic layer TL1 disposed on the first light emitting element ED1, a second inorganic layer TL2 disposed on the second light emitting element ED2, and a third inorganic layer TL3 disposed on the third light emitting element ED3. The first to third inorganic layers TL1, TL2, and TL3 may be formed on the entire bank structure BNS, and may cover just the light emitting elements ED1, ED2, and ED3, organic patterns ELP1, ELP2, and ELP3 to be described later, and the electrode patterns CEP1, CEP2, and CEP3 in the respective emission areas EA1, EA2, and EA3 without being disposed between the emission areas EA1, EA2, and EA3. The shape of the inorganic layers TL1, TL2, and TL3 may be formed by forming the inorganic layers TL1, TL2, and TL3 to completely cover the bank structure BNS and then partially patterning the inorganic layers TL1, TL2, and TL3.

The display device 10 may include patterns that are traces of the deposition process and the shape of the bank structure BNS. The patterns may be formed simultaneously with the light emitting layers EL1, EL2, and EL3 of the light emitting elements ED1, ED2, and ED3 and the common electrodes CE1, CE2, and CE3, and may remain on the bank structure BNS. Hereinafter, the structures of the light emitting layers EL1, EL2, and EL3 and the common electrodes CE1, CE2, and CE3, and the patterns will be described.

The light emitting layers EL1, EL2, and EL3 may be disposed on the pixel electrodes AE1, AE2, and AE3, respectively. The light emitting layers EL1, EL2, and EL3 may be organic light emitting layers made of an organic material, and may be formed on the pixel electrodes AE1, AE2, and AE3, respectively, by the deposition process. In the light emitting layers EL1, EL2, and EL3, when the thin film transistor TFT applies a predetermined voltage to the pixel electrodes AE1, AE2, and AE3 of the light emitting elements ED1, ED2, and ED3, and the common electrodes CE1, CE2, and CE3 of the light emitting elements ED1, ED2, and ED3 receive a common voltage or a cathode voltage, holes and electrons may move to the light emitting layers EL1, EL2, and EL3 through a hole transporting layer and an electron transporting layer, respectively, and the holes and the electrons may be combined with each other in the light emitting layers EL1, EL2, and EL3 to emit light.

The light emitting layers EL1, EL2, and EL3 may include the first light emitting layer EL1, the second light emitting layer EL2, and the third light emitting layer EL3 disposed in the different emission areas EA1, EA2, and EA3. The first light emitting layer EL1 may be disposed on the first pixel electrode AE1 in the first emission area EA1, the second light emitting layer EL2 may be disposed on the second pixel electrode AE2 in the second emission area EA2, and the third light emitting layer EL3 may be disposed on the third pixel electrode AE3 in the third emission area EA3. The first to third light emitting layers EL1, EL2, and EL3 may be the light emitting layers of the first to third light emitting elements ED1, ED2 and ED3, respectively. The first light emitting layer EL1 may be the light emitting layer emitting red light of the first color, the second light emitting layer EL2 may be the light emitting layer emitting green light of the second color, and the third light emitting layer EL3 may be the light emitting layer emitting blue light of the third color.

In accordance with an embodiment of the present disclosure, the light emitting layers EL1, EL2, and EL3 of the light emitting elements ED1, ED2, and ED3 may be partially disposed between the pixel electrodes AE1, AE2, and AE3 and the inorganic insulating layer ISL. The inorganic insulating layer ISL may be disposed on the pixel electrodes AE1, AE2, and AE3, but may be spaced apart from the top surfaces of the pixel electrodes AE1, AE2, and AE3. The deposition process of the light emitting layers EL1, EL2, and EL3 may be performed such that the material of the light emitting layer is deposited in an inclined direction rather than in a direction perpendicular to the top surface of the substrate SUB. Accordingly, the light emitting layers EL1, EL2, and EL3 may be disposed on the upper surfaces of the pixel electrodes AE1, AE2, and AE3 exposed in the openings OPE1, OPE2, and OPE3 of the bank structure BNS, and may fill spaces between the pixel electrodes AE1, AE2, and AE3 and the inorganic insulating layer ISL.

In the manufacturing process of the display device 10, the sacrificial layer SFL (see FIG. 8) may be disposed between the inorganic insulating layer ISL and the pixel electrodes AE1, AE2, and AE3, and the light emitting layers EL1, EL2, and EL3 may be disposed in the region where the sacrificial layer SFL is partially removed. Accordingly, the bottom surface of the inorganic insulating layer ISL may be spaced apart from the pixel electrodes AE1, AE2, and AE3. However, the sacrificial layer SFL may remain as a partial residual pattern RP in the region between the inorganic insulating layer ISL and the pixel electrodes AE1, AE2, and AE3. The region between the inorganic insulating layer ISL and the pixel electrodes AE1, AE2, and AE3 may be filled with the partial residual pattern RP and the light emitting layers EL1, EL2, and EL3.

The display device 10, according to an embodiment of the present disclosure, may include the plurality of organic patterns ELP1, ELP2, and ELP3 including the same material as those of the light emitting layers EL1, EL2, and EL3 and disposed on the bank structure BNS. Since the light emitting layers EL1, EL2, and EL3 are formed by a process of depositing a material on the entire surface of the display device 10, the materials forming the light emitting layers EL1, EL2, and EL3 may also be deposited on the bank structure BNS in addition to the openings OPE1, OPE2, and OPE3 of the bank structure BNS.

For example, the display device 10 may include the organic patterns ELP1, ELP2, and ELP3 disposed on the bank structure BNS. The organic patterns ELP1, ELP2, and ELP3 may include the first organic pattern ELP1, the second organic pattern ELP2, and the third organic pattern ELP3 disposed on the second bank layer BN2 of the bank structure BNS.

The first organic pattern ELP1 may include the same material as that of the first light emitting layer EL1 of the first light emitting element ED1. The second organic pattern ELP2 may include the same material as that of the second light emitting layer EL2 of the second light emitting element ED2, and the third organic pattern ELP3 may include the same material as that of the third light emitting layer EL3 of the third light emitting element ED3. The organic patterns ELP1, ELP2, and ELP3 may be formed in the same process as the process of forming the light emitting layers EL1, EL2, and EL3 including the same material as those of the organic patterns ELP1, ELP2, and ELP3.

The first organic pattern ELP1, the second organic pattern ELP2, and the third organic pattern ELP3 may be disposed directly on the second bank layer BN2 of the bank structure BNS. The organic patterns ELP1, ELP2, and ELP3 may be formed in the same process as the process of forming the light emitting layers EL1, EL2, and EL3 including the same material as those of the organic patterns ELP1, ELP2, and ELP3, and may be disposed near the emission areas EA1, EA2, and EA3 in which the light emitting layers EL1, EL2 and EL3 are disposed, respectively. For example, the first organic pattern ELP1 may be disposed on the second bank layer BN2 while at least partially surrounding the first opening OPE1 near the first opening OPE1 or the first emission area EA1. The second organic pattern ELP2 may be disposed on the second bank layer BN2 while at least partially surrounding the second opening OPE2 near the second opening OPE2 or the second emission area EA2, and the third organic pattern ELP3 may be disposed on the second bank layer BN2 while at least partially surrounding the third opening OPE3 near the third opening OPE3 or the third emission area EA3.

The organic patterns ELP1, ELP2, and ELP3 may be traces that are disconnected from the light emitting layers EL1, EL2, and EL3 due to the tip TIP of the bank structure BNS. The light emitting layers EL1, EL2, and EL3 may be formed in the openings OPE1, OPE2, and OPE3, respectively, and the organic patterns ELP1, ELP2, and ELP3 and the light emitting layers EL1, EL2, and EL3 may be disconnected by the tip TIP formed on the sidewalls of the openings OPE1, OPE2, and OPE3. Since the light emitting layers EL1, EL2, and EL3 are formed by the deposition process using no mask, the materials of the light emitting layers EL1, EL2, and EL3 may be formed on the entire bank structure BNS. The organic patterns ELP1, ELP2, and ELP3 may be formed by patterning them near the emission areas EA1, EA2, and EA3 or the openings OPE1, OPE2, and OPE3.

The common electrodes CE1, CE2, and CE3 may be disposed on the light emitting layers EL1, EL2, and EL3, respectively. The common electrodes CE1, CE2, and CE3 may include a transparent conductive material, so that the light generated in the light emitting layers EL1, EL2, and EL3 may be emitted. The common electrodes CE1, CE2, and CE3 may receive a common voltage or a low potential voltage. When the pixel electrodes AE1, AE2, and AE3 receive the voltage corresponding to a data voltage and the common electrodes CE1, CE2, and CE3 receive the low potential voltage, a potential difference is formed between the pixel electrodes AE1, AE2, and AE3 and the common electrodes CE1, CE2, and CE3, so that the light emitting layers EL1, ED2, and ED3 may emit light.

The common electrodes CE1, CE2, and CE3 may include the first common electrode CE1, the second common electrode CE2, and the third common electrode CE3 disposed in the different emission areas EA1, EA2, and EA3. The first common electrode CE1 may be disposed on the first light emitting layer EL1 in the first emission area EA1, the second common electrode CE2 may be disposed on the second light emitting layer EL2 in the second emission area EA2, and the third common electrode CE3 may be disposed on the third light emitting layer EL3 in the third emission area EA3.

In accordance with an embodiment of the present disclosure, the common electrodes CE1, CE2, and CE3 of the light emitting elements ED1, ED2, and ED3 may be partially disposed on the side surface of the first bank layer BN1 of the bank structure BNS. Similarly to the light emitting layers EL1, EL2, and EL3, the common electrodes CE1, CE2, and CE3 may also be formed by a deposition process. The deposition process of the common electrodes CE1, CE2, and CE3 may be performed such that the electrode material is deposited in an inclined direction rather than a direction perpendicular to the top surface of the substrate SUB. Accordingly, the common electrodes CE1, CE2, and CE3 may be disposed on the side surface of the first bank layer BN1 under the tip TIP of the second bank layer BN2 of the bank structure BNS. The common electrodes CE1, CE2, and CE3 may be in direct contact with the side surface of the first bank layer BN1. The common electrodes CE1, CE2, and CE3 of the different light emitting elements ED1, ED2, and ED3 may be in direct contact with the first bank layer BN1 of the bank structure BNS, and the common electrodes CE1, CE2, and CE3 may be electrically connected to each other. Unlike the pixel electrodes AE1, AE2, and AE3, the common electrodes CE1, CE2, and CE3 may be implemented in the form of an electrode that is electrically common to all pixels without being divided for a plurality of pixels.

In accordance with an embodiment of the present disclosure, the contact area between the common electrodes CE1, CE2, and CE3 and the side surface of the first bank layer BN1 may be greater than the contact area between the light emitting layers EL1, EL2, and EL3 and the side surface of the first bank layer BN1. The common electrodes CE1, CE2, and CE3 and the light emitting layers EL1, EL2, and EL3 are formed such that the materials thereof are deposited in an inclined direction rather than in a direction perpendicular to the top surface of the substrate SUB, and the area disposed on the side surface of the first bank layer BN1 may vary depending on the inclined angle. In an embodiment of the present disclosure, the deposition process of the common electrodes CE1, CE2, and CE3 may be performed in a more inclined direction than that in the deposition process of the light emitting layers EL1, EL2, and EL3. The common electrodes CE1, CE2, and CE3 may be disposed in larger areas on the sidewalls of the openings OPE1, OPE2, and OPE3 compared to the light emitting layers EL1, EL2, and EL3, or may be located at higher positions on the sidewalls of the openings OPE1, OPE2, and OPE3 compared to the light emitting layers EL1, EL2, and EL3. Since the common electrodes CE1, CE2, and CE3 of the different light emitting elements ED1, ED2, and ED3 are electrically connected through the first bank layer BN1, they may be in contact with the first bank layer BN1 in larger areas.

The display device 10, according to an embodiment of the present disclosure, may include the plurality of electrode patterns CEP1, CPE2, and CEP3 including the same material as those of the common electrodes CE1, CE2, and CE3 and disposed on the bank structure BNS. Since the common electrodes CE1, CE2, and CE3 are formed by a process of depositing a material on the entire surface of the display device 10, the materials forming the common electrodes CE1, CE2, and CE3 may also be deposited on the bank structure BNS in addition to the openings OPE1, OPE2, and OPE3 of the bank structure BNS.

The display device 10 may include the electrode patterns CEP1, CPE2, and CEP3 disposed above the bank structure BNS. The electrode patterns CEP1, CPE2, and CEP3 may include the first electrode pattern CEP1, the second electrode pattern CEP2, and the third electrode pattern CEP3 disposed on the second bank layer BN2 of the bank structure BNS.

For example, the first electrode pattern CEP1, the second electrode pattern CEP2, and the third electrode pattern CEP3 may be disposed directly on the first organic pattern ELP1, the second organic pattern ELP2, and the third organic pattern ELP3, respectively. The arrangement relationship of the electrode patterns CEP1, CPE2, and CEP3 and the organic patterns ELP1, ELP2, and ELP3 may be the same as the arrangement relationship of the light emitting layers EL1, EL2, and EL3 of the light emitting elements ED1, ED2, and ED3 and the common electrodes CE1, CE2, and CE3. The electrode patterns CEP1, CPE2, and CEP3 may be traces formed because the deposited material is disconnected without being connected with the common electrodes CE1, CE2, and CE3 due to the tip TIP of the bank structure BNS. In the display device 10, the common electrodes CE1, CE2, and CE3 may be individually formed in different areas even in a deposition process using no mask due to the tip TIP of the bank structure BNS.

A capping layer CPL may be disposed on the common electrodes CE1, CE2, and CE3. The capping layer CPL may include an inorganic insulating material covering the patterns disposed on the bank structure BNS and the light emitting elements ED1, ED2, and ED3. The capping layer CPL may prevent the light emitting elements ED1, ED2, and ED3 from being damaged by external air and prevent the patterns disposed on the bank structure BNS from being peeled off during the manufacturing process of the display device 10. In an embodiment of the present disclosure, the capping layer CPL may include aluminum oxide, titanium oxide, tantalum oxide, hafnium oxide, zinc oxide, silicon oxide, silicon nitride, and/or silicon oxynitride.

The display device 10 may include a capping pattern CLP disposed on the bank structure BNS. The capping pattern CLP may be disposed directly on the first electrode pattern CEP1, the second electrode pattern CEP2, and the third electrode pattern CEP3 disposed on the second bank layer BN2 of the bank structure BNS. The arrangement relationship of the capping pattern CLP and the electrode patterns CEP1, CEP2, and CEP3 may be the same as the arrangement relationship of the common electrodes CE1, CE2, and CE3 of the light emitting elements ED1, ED2, and ED3 and the capping layer CPL. The capping pattern CLP may be a trace formed because the deposited material is disconnected without being connected with the capping layer CPL due to the tip TIP of the bank structure BNS.

The plurality of organic patterns ELP1, ELP2, and ELP3, the electrode patterns CEP1, CPE2, and CEP3, and the capping pattern CLP may be disposed on the bank structure BNS, and may at least partially surround the peripheries of the emission areas EA1, EA2, and EA3 or the openings OPE1, OPE2, and OPE3, respectively. The stacked structure of the organic patterns ELP1, ELP2, and ELP3, the electrode patterns CEP1, CPE2, and CEP3, and the capping pattern CLP disposed around the emission areas EA1, EA2, and EA3 may be partially etched in the manufacturing process of the display device 10, so that the pattern shape may be changed. Accordingly, a part of the top surface of the second bank layer BN2 of the bank structure BNS might not be covered by the organic patterns ELP1, ELP2, and ELP3, the electrode patterns CEP1, CPE2, and CEP3, and the capping pattern CLP.

The thin film encapsulation layer TFEL may be disposed on the light emitting elements ED1, ED2, and ED3 and the bank structure BNS, and may cover the plurality of light emitting elements ED1, ED2, and ED3 and the bank structure BNS. The thin film encapsulation layer TFEL may include at least one inorganic layer to prevent oxygen or moisture from permeating into the light emitting element layer EML. The thin film encapsulation layer TFEL may include at least one organic layer to protect the light emitting element layer EML from foreign substances such as dust.

In an embodiment of the present disclosure, the thin film encapsulation layer TFEL may include a first encapsulation layer TFE1, a second encapsulation layer TFE2, and a third encapsulation layer TFE3 that are sequentially stacked. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. For example, the second encapsulation layer TFE2 may include an acrylic resin, for example, polymethyl methacrylate, polyacrylic acid, or the like. The second encapsulation layer TFE2 may be formed by curing a monomer or applying a polymer.

The first encapsulation layer TFE1 may be disposed on the light emitting elements ED1, ED2, and ED3, the plurality of patterns, and the bank structure BNS. The first encapsulation layer TFE1 may include the first inorganic layer TL1, the second inorganic layer TL2, and the third inorganic layer TL3 corresponding to the different emission areas EA1, EA2, and EA3, respectively.

The first inorganic layer TL1, the second inorganic layer TL2, and the third inorganic layer TL3 may include an inorganic insulating material covering the light emitting elements ED1, ED2, and ED3, respectively. The first inorganic layer TL1, the second inorganic layer TL2, and the third inorganic layer TL3 may prevent the light emitting elements ED1, ED2, and ED3 from being damaged by external air, and may prevent the patterns disposed on the bank structure BNS from being peeled off during the manufacturing process of the display device 10. In an embodiment of the present disclosure, the first inorganic layer TL1, the second inorganic layer TL2, and the third inorganic layer TL3 may include aluminum oxide, titanium oxide, tantalum oxide, hafnium oxide, zinc oxide, silicon oxide, silicon nitride, and/or silicon oxynitride.

The first inorganic layer TL1, the second inorganic layer TL2, and the third inorganic layer TL3 may cover the organic patterns ELP1, ELP2, and ELP3, the electrode patterns CEP1, CPE2, and CEPS, and the capping pattern CLP. Since the first inorganic layer TL1, the second inorganic layer TL2, and the third inorganic layer TL3 may be formed by a chemical vapor deposition (CVD) method, they may have a uniform thickness along the stepped portion of the deposited layers. For example, the first inorganic layer TL1, the second inorganic layer TL2, and the third inorganic layer TL3 may form thin films even under the undercut by the tip TIP of the bank structure BNS.

The first inorganic layer TL1 may be disposed on the first light emitting element ED1 and the first electrode pattern CEP1. The first inorganic layer TL1 may cover the first light emitting element ED1 and the first opening OPE1 along the inner sidewalls thereof, and may also cover the first organic pattern ELP1, the first electrode pattern CEP1, and the capping pattern CLP. However, the first inorganic layer TL1 might not overlap the second opening OPE2 and the third opening OPE3, and may be disposed exclusively on the first opening OPE1 and the bank structure BNS adjacent thereto.

The second inorganic layer TL2 may be disposed on the second light emitting element ED2 and the second electrode pattern CEP2. The second inorganic layer TL2 may cover the second light emitting element ED2 and the second opening OPE2 along the inner sidewalls thereof, and may also cover the second organic pattern ELP2, the second electrode pattern CEP2, and the capping pattern CLP. However, the second inorganic layer TL2 might not overlap the first opening OPE1 and the third opening OPE3, and may be disposed only on the second opening OPE2 and the bank structure BNS adjacent thereto.

The third inorganic layer TL3 may be disposed on the third light emitting element ED3 and the third electrode pattern CEP3. The third inorganic layer TL3 may be disposed along the inner sidewalls of the third light emitting element ED3 and the third opening OPE3 and may cover them, and may also cover the third organic pattern ELP3, the third electrode pattern CEP3, and the capping pattern CLP. However, the third inorganic layer TL3 might not overlap the first opening OPE1 and the second opening OPE2, and may be disposed exclusively on the third opening OPE3 and the bank structure BNS adjacent thereto.

The first inorganic layer TL1 may be formed after the first common electrode CE1 is formed, the second inorganic layer TL2 may be formed after the second common electrode CE2 is formed, and the third inorganic layer TL3 may be formed after the third common electrode CE3 is formed. Accordingly, the first to third inorganic layers TL1, TL2, and TL3 may cover the different electrode patterns CEP1, CPE2, and CEP3 and the organic patterns ELP1, ELP2, and ELP3, respectively. In a plan view, the first inorganic layer TL1, the second inorganic layer TL2, and the third inorganic layer TL3 may have larger areas than those of the openings OPE1, OPE2, and OPE3 of the bank structure BNS, respectively. The first inorganic layer TL1, the second inorganic layer TL2, and the third inorganic layer TL3 may be spaced apart from each other on the bank structure BNS. Accordingly, a part of the second bank layer BN2 of the bank structure BNS might not overlap the inorganic layers TL1, TL2, and TL3, and a part of the top surface thereof may be exposed without being covered by the inorganic layers TL1, TL2, and TL3. A part of the second bank layer BN2 may be in direct contact with the second encapsulation layer TFE2 of the thin film encapsulation layer TFEL which will be described later.

The touch sensing layer TSU may be disposed on the encapsulation layer TFEL. The touch sensing layer TSU may include a first touch insulating layer SIL1 a second touch insulating layer SIL2, a touch electrode TEL, and a third touch insulating layer SIL3.

The first touch insulating layer SIL1 may be disposed on the encapsulation layer TFEL. The first touch insulating layer SIL1 may have an insulating and optical function. The first touch insulating layer SIL1 may include at least one inorganic layer. Optionally, the first touch insulating layer SIL1 may be omitted.

The second touch insulating layer SIL2 may cover the first touch insulating layer SIL1. A touch electrode of another layer may be further disposed on the first touch insulating layer SILL and the second touch insulating layer SIL2 may cover the touch electrode TEL. The second touch insulating layer SIL2 may have an insulating and optical function. For example, the second touch insulating layer SIL2 may be an inorganic layer including a silicon nitride layer, a silicon oxynitride layer, a silicon oxide layer, a titanium oxide layer, and/or an aluminum oxide layer.

A part of the touch electrode TEL may be disposed on the second touch insulating layer SIL2. The touch electrode TEL might not overlap the first to third emission areas EA1, EA2, and EA3. The touch electrode TEL may include a single layer including molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The third touch insulating layer SIL3 may cover the touch electrode TEL and the second touch insulating layer SIL2. The third touch insulating layer SIL3 may have an insulating and optical function. The third touch insulating layer SIL3 may be made of the material exemplified in association with the second touch insulating layer SIL2.

The light blocking layer BM may be disposed on the touch sensing layer TSU. The light blocking layer BM may include the plurality of opening holes OPT1, OPT2, and OPT3 at least partially overlapping the emission areas EA1, EA2, and EA3. For example, the first opening hole OPT1 may at least partially overlap the first emission area EA1. The second opening hole OPT2 may at least partially overlap the second emission area EA2, and the third opening hole OPT3 may at least partially overlap the third emission area EA3. The areas or sizes of the opening holes OPT1, OPT2, and OPT3 may be larger than the areas or sizes of the emission areas EA1, EA2, and EA3 defined by the bank structure BNS, respectively. The opening holes OPT1, OPT2, and OPT3 of the light blocking layer BM are larger than the emission areas EA1, EA2, and EA3, so that the light emitted from the emission areas EA1, EA2, and EA3 may be visually recognized by the user not only from the front surface but also from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include lactam black, perylene black, and/or aniline black, but they are not necessarily limited thereto. The light blocking layer BM may prevent visible light infiltration and color mixture between the first to third emission areas EA1, EA2, and EA3, which leads to better color reproducibility of the display device 10.

The display device 10 may include the plurality of color filters CF1, CF2, and CF3 disposed on the emission areas EA1, EA2, and EA3. The plurality of color filters CF1, CF2, and CF3 may correspond to the emission areas EA1, EA2, and EA3, respectively. For example, the color filters CF1, CF2, and CF3 may be disposed on the light blocking layer BM including the plurality of opening holes OPT1, OPT2, and OPT3 corresponding to the emission areas EA1, EA2, and EA3, respectively. The holes of the light blocking layer may at least partially overlap the emission areas EA1, EA2, and EA3, or the openings of the bank structures BNS, and may form a light exit area from which the light emitted from the emission areas EA1, EA2, and EA3 is emitted. The color filters CF1, CF2, and CF3 may have areas larger than those of the holes of the light blocking layer BM, and the color filters CF1, CF2, and CF3 may completely cover the light exit area formed by the holes.

The color filters CF1, CF2, and CF3 may include a first color filter CF1, a second color filter CF2, and a third color filter CF3 corresponding to the different emission areas EA1, EA2, and EA3, respectively. The color filters CF1, CF2, and CF3 may include a colorant such as a dye or a pigment that absorbs light in a wavelength band other than light in a specific wavelength band, and may correspond to the color of the light emitted from the emission areas EA1, EA2, and EA3. For example, the first color filter CF1 may be a red color filter that at least partially overlaps the first emission area EA1 and transmits only the first light of the red color. The second color filter CF2 may be a green color filter that at least partially overlaps the second emission area EA2 and transmits only the second light of the green color, and the third color filter CF3 may be a blue color filter that at least partially overlaps the third emission area EA3 and transmits only the third light of the blue color.

The plurality of color filters CF1, CF2, and CF3 may be spaced apart from other adjacent color filters CF1, CF2, and CF3 on the light blocking layer BM. The color filters CF1, CF2, and CF3 may have areas larger than those of the opening holes OPT1, OPT2, and OPT3 of the light blocking layer BM, respectively, while covering the holes, and may have areas enough to be spaced apart from other color filters CF1, CF2, and CF3 on the light blocking layer BM. However, the disclosure is not necessarily limited thereto. The plurality of color filters CF1, CF2, and CF3 may partially overlap other adjacent color filters CF1, CF2, and CF3. The different color filters CF1, CF2, and CF3 are areas that do not overlap the emission areas EA1, EA2, and EA3, and may at least partially overlap each other on the light blocking layer BM, to be described later. In the display device 10, the color filters CF1, CF2, and CF3 at least partially overlap each other, so that the intensity of the reflected light by external light may be reduced. Furthermore, the color of the reflected light by the external light may be controlled by adjusting the disposition, shape, and area of the color filters CF1, CF2, and CF3 in a plan view.

The color filters CF1, CF2, and CF3 of the color filter layer CFL may be disposed on the light blocking layer BM. The different color filters CF1, CF2, and CF3 may correspond to the different emission areas EA1, EA2, and EA3 or openings OPE1, OPE2, and OPE3, and the opening holes OPT1, OPT2, and OPT3 of the light blocking layer BM, respectively. For example, the first color filter CF1 may correspond to the first emission area EA1, the second color filter CF2 may correspond to the second emission area EA2, and the third color filter CF3 may correspond to the third emission area EA3. The first color filter CF1 may be disposed in the first opening hole OPT1 of the light blocking layer BM, the second color filter CF2 may be disposed in the second opening hole OPT2 of the light blocking layer BM, and the third color filter CF3 may be disposed in the third opening hole OPT3 of the light blocking layer BM. Each of the color filters CF1, CF2, and CF3 may have a larger area in a plan view than the opening holes OPT1, OPT2, and OPT3 of the light blocking layer BM, and some may be disposed directly on the light blocking layer BM.

An overcoat layer OC may be disposed on the color filters CF1, CF2, and CF3 to planarize the top ends of the color filters CF1, CF2, and CF3. The overcoat layer OC may be a colorless light transmissive layer that does not have a color in a visible light band. For example, the overcoat layer OC may include a colorless light transmissive organic material such as an acrylic resin.

Figure 8:
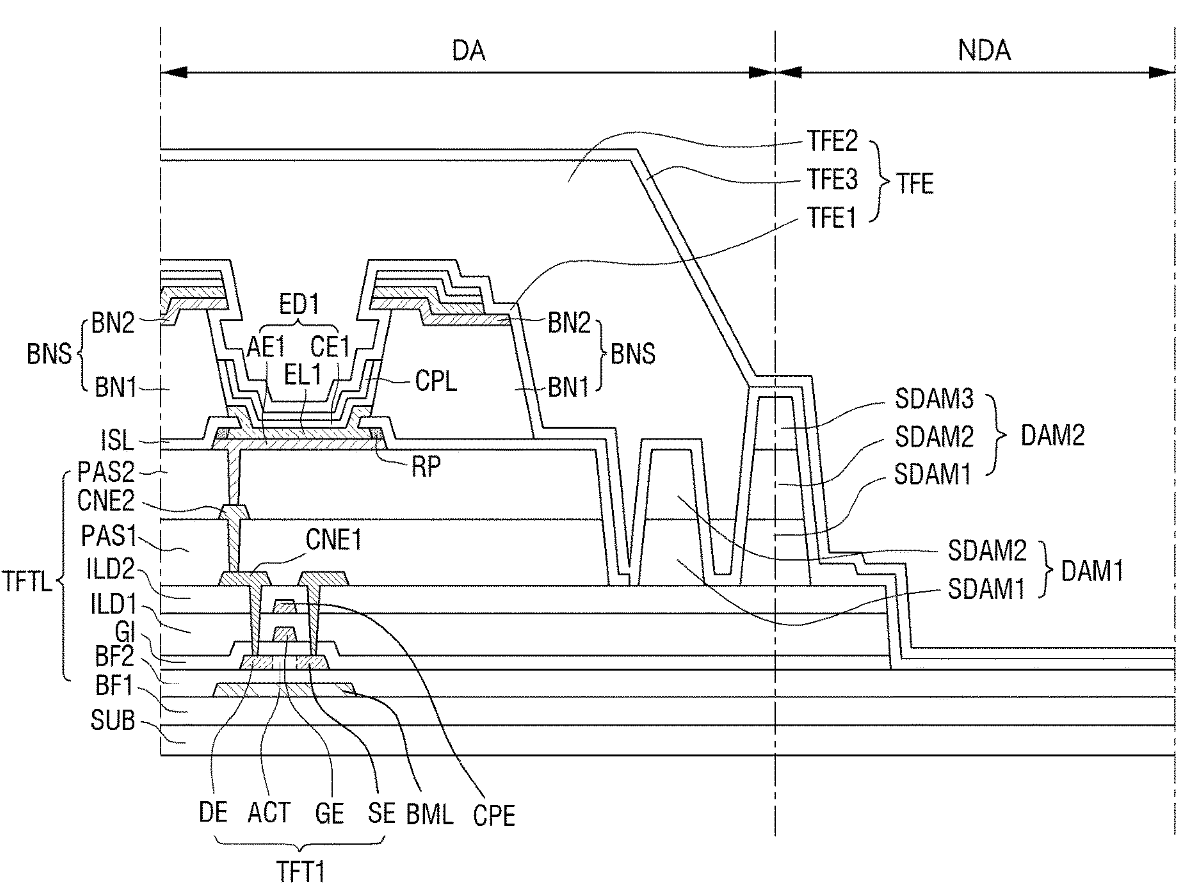
FIG. 8 is a cross-sectional view illustrating a part of a non-display area of a display device according to an embodiment of the present disclosure.

FIG. 8 is a cross-sectional view illustrating a part of a non-display area of a display device according to an embodiment of the present disclosure. FIG. 8 is a cross-sectional view illustrating a part of the non-display area NDA on the left or right side of the display area DA. FIG. 8 illustrates the arrangement of the thin film transistor layer TFTL, the light emitting elements ED1, ED2, and ED3, the bank structure BNS, and the thin film encapsulation layer TFTL.

Referring to FIG. 8, the display device 10 may include a first dam DAM1 and a second dam DAM2 disposed in the non-display area NDA. The first dam DAM1 and the second dam DAM2 may be disposed at the outermost portion of the display area DA, and may at least partially surround the display area DA. The first dam DAM1 and the second dam DAM2 may prevent the second encapsulation layer TFE2 of the thin film encapsulation layer TFEL from overflowing to the non-display area NDA.

The first dam DAM1 may include a first sub-dam SDAM1 and a second sub-dam SDAM2, and the second dam DAM2 may include a first sub-dam SDAM1, a second sub-dam SDAM2, and a third sub-dam SDAM3. The first sub-dam SDAM1 and the first passivation layer PAS1 may include the same material, and may be disposed on the same layer. The second sub-dam SDAM2 and the second passivation layer PAS2 may include the same material, and may be disposed on the same layer. The third sub-dam SDAM3 may be disposed on the second sub-dam SDAM2, and may include the same material as that of the second sub-dam SDAM2. The third sub-dam SDAM3 may be located at the same height as the inorganic insulating layer ISL disposed in the display area DA. In an embodiment of the present disclosure, the third sub-dam SDAM3 and the inorganic insulating layer ISL may include the same material and may be disposed on the same layer.

The height of the first dam DAM1 may be lower than the height of the second dam DAM2. However, the disclosure is not necessarily limited thereto. The height of the first dam DAM1 may be substantially the same as the height of the second dam DAM2 or may be higher than the height of the second dam DAM2.

The first encapsulation layer TFE1 and the third encapsulation layer TFE3 may cover the first dam DAM1 and the second dam DAM2 disposed at the outermost portion of the display area DA. The first encapsulation layer TFE1 and the third encapsulation layer TFE3 may extend to the outermost edge of the display panel 100 over the first dam DAM1 and the second dam DAM2.

The second encapsulation layer TFE2 may cover the top surface of the first dam DAM1 without covering the top surface of the second dam DAM2. However, the disclosure is not necessarily limited thereto. The second encapsulation layer TFE2 might not cover both the top surface of the first dam DAM1 and the top surface of the second dam DAM2. The second encapsulation layer TFE2 might not overflow to the edge of the display panel 100 due to the first dam DAM1 and the second dam DAM2.

Among the thin film transistor layers TFTL, the gate insulating layer GI, the first interlayer insulating layer ILD1, the second interlayer insulating layer ILD2, the first passivation layer PAS1, and the second passivation layer PAS2 may be removed at the outer portion of the second dam DAM2. Just the buffer layers BF1 and BF2 of the thin film transistor layer TFTL may be disposed at the outer side of the second dam DAM2, and the first encapsulation layer TFE1 and the third encapsulation layer TFE3 extending to the outermost edge of the display panel 100 may be disposed directly on the second buffer layer BF2.

Figure 9:
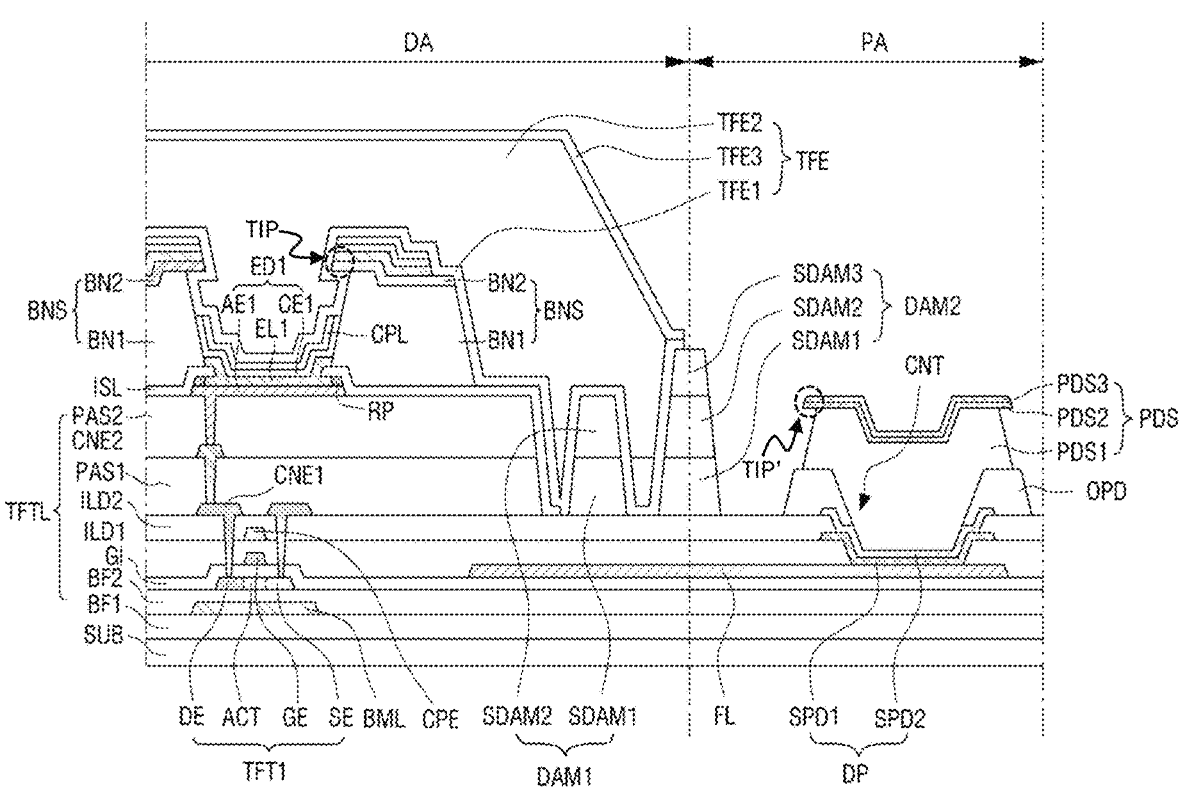
FIG. 9 is a cross-sectional view illustrating a part of a non-display area of a display device according to an embodiment of the present disclosure.
Figure 10:
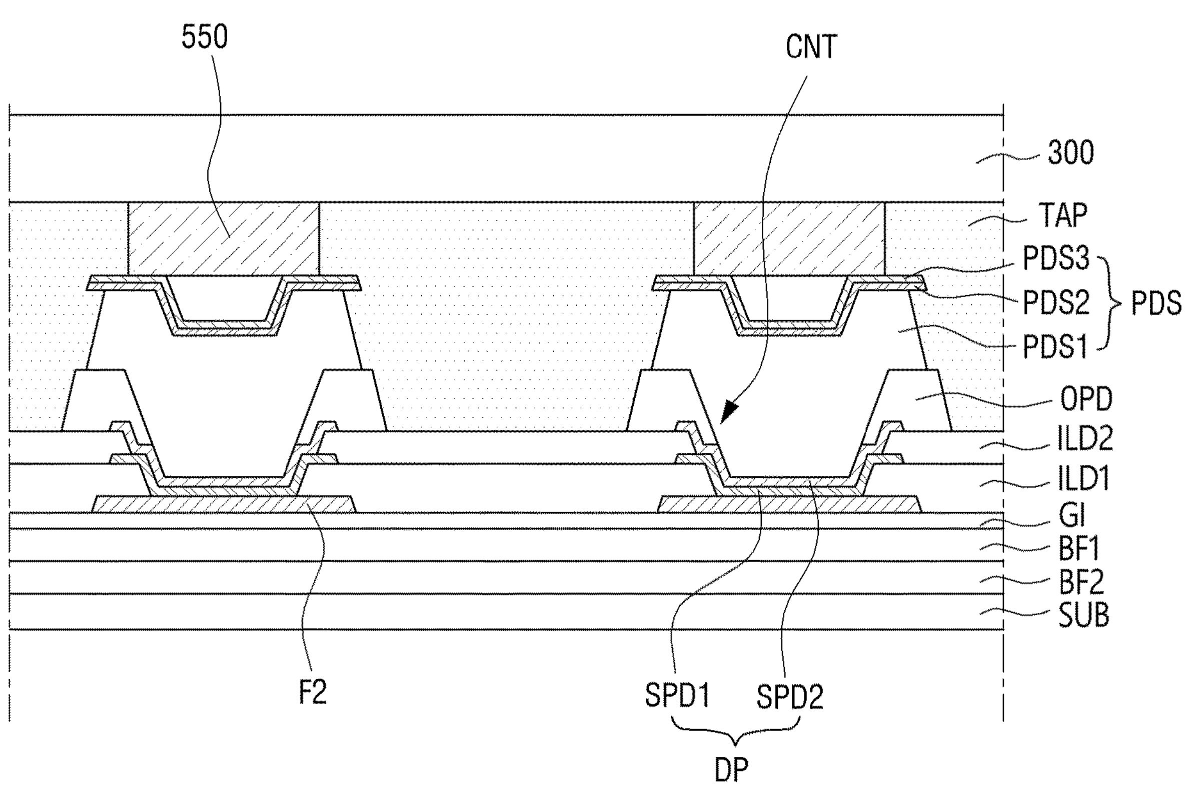
FIG. 10 is a cross-sectional view illustrating a pad area of a display device according to an embodiment of the present disclosure and a circuit board disposed thereon.

FIG. 9 is a cross-sectional view illustrating another part of a non-display area of a display device according to an embodiment of the present disclosure. FIG. 10 is a cross-sectional view illustrating a pad area of a display device according to an embodiment of the present disclosure and a circuit board disposed thereon. FIG. 9 is a cross-sectional view illustrating a part of the non-display area NDA including the pad area PA disposed on the lower side of the display area DA.

Referring to FIGS. 9 and 10, the display device 10 may include the display pad portion DP disposed in the pad area PA, and a pad organic layer OPD and a pad structure PDS disposed thereon.

Unlike the non-display area NDA on the left and right sides of the display area DA, in the pad area PA, the gate insulating layer GI, the first interlayer insulating layer ILD1, and the second interlayer insulating layer ILD2 of the thin film transistor layer TFTL may be disposed. However, the first passivation layer PAS1 and the second passivation layer PAS2 might not be disposed in the pad area PA, and the top surface of the second interlayer insulating layer ILD2 may be exposed in the pad area PA.

Since the display pad portion DP and the pad structure PDS are disposed in the pad area PA, the first encapsulation layer TFE1 and the third encapsulation layer TFE3 might not extend over the second dam DAM2. The first encapsulation layer TFE1 and the third encapsulation layer TFE3 may cover the first dam DAM1 and only a part of the second dam DAM2 in the pad area PA positioned on the lower side of the display panel 100. For example, the first encapsulation layer TFE1 and the third encapsulation layer TFE3 might not cover a part of the top surface of the second dam DAM2. Alternatively, the first encapsulation layer TFE1 and the third encapsulation layer TFE3 may cover the second dam DAM2, but may be spaced apart from at least the display pad portion DP so as not to cover it. For example, the first encapsulation layer TFE1 and the third encapsulation layer TFE3 might not extend to the outermost edge of the display panel 100 on the lower side of the display panel 100.

A fan-out line FL may be disposed in the pad area PA of the display panel 100. The fan-out line FL and the gate electrode GE of the thin film transistor layer TFTL may be disposed on the same layer, and may include the same material. The fan-out line FL may be electrically connected to the wires disposed in the display area DA. The wires disposed in the display area DA may be electrically connected to the circuit board 300 through the fan-out line FL, the display pad portion DP, and the pad structure PDS.

The display pad portion DP may include a first sub-pad SPD1 and a second sub-pad SPD2.

The first sub-pad SPD1 and the capacitor electrode CPE may be disposed on the same layer, and may include the same material. The first sub-pad SPD1 may be disposed on the first interlayer insulating layer ILD1, and may be in direct contact with the fan-out line FL through a contact hole penetrating the first interlayer insulating layer ILD1 in the pad area PA. The first sub-pad SPD1 may be formed as a single layer or multiple layers including molybdenum (Mo), aluminum (Al), chromium (Cr), gold (Au), titanium (Ti), nickel (Ni), neodymium (Nd) and/or copper (Cu) or an alloy thereof.

The second sub-pad SPD2 and the first connection electrode CNE1 may be disposed on the same layer, and may include the same material. The second sub-pad SPD2 may be disposed on the second interlayer insulating layer ILD2, and may be in direct contact with the first sub-pad SPD1 through a contact hole penetrating the second interlayer insulating layer ILD2. The second sub-pad SPD2 may be formed as a single layer or multiple layers including molybdenum (Mo), aluminum (Al), chromium (Cr), gold (Au), titanium (Ti), nickel (Ni), neodymium (Nd) and/or copper (Cu) or an alloy thereof.

The pad organic layer OPD may be disposed on the display pad portion DP. The pad organic layer OPD may be disposed on the second interlayer insulating layer ILD2 in the pad area PA, and may cover a part of the display pad portion DP. The pad organic layer OPD may include a contact hole CNT penetrating therethrough and expose a part of the top surface of the display pad portion DP. The display pad portion DP exposed through the contact hole CNT of the pad organic layer OPD may be in direct contact with a first pad layer PDS1 of the pad structure PDS.

The pad organic layer OPD may include the same material as that of the first passivation layer PAS1, the second passivation layer PAS2, and/or the first to third sub-dams SDAM1, SDAM2, and/or SDAM3. Although the first passivation layer PAS1 and the second passivation layer PAS2 are not disposed in the non-display area NDA and the pad area PA, some of them may remain on the display pad portion DP to form the pad organic layer OPD. Alternatively, in the process of forming the third sub-dam SDAM3 of the second dam DAM2, the pad organic layer OPD may be formed together with the third sub-dam SDAM3. Although it is illustrated in the drawing that the pad organic layer OPD is formed as a single layer, the disclosure is not necessarily limited thereto. In an embodiment of the present disclosure, the pad organic layer OPD may have a structure in which a plurality of layers are stacked similarly to the first dam DAM1 and the second dam DAM2. In this case, the pad organic layer OPD may include a layer disposed on the same layer as the first passivation layer PAS1 and/or the second passivation layer PAS2. The pad organic layer OPD may supplement the height of the pad structure PDS disposed thereon so that the pad structure PDS may be in smooth contact with a bump 550 of the circuit board 300.

The pad structure PDS may be disposed on the pad organic layer OPD. The pad structure PDS may be electrically connected to each of the circuit board 300 disposed thereon and the display pad portion DP disposed thereunder. For example, the circuit board 300 may be attached on the pad area PA of the display panel 100 by an adhesive member TAP, and the pad structure PDS may be in direct contact with and electrically connected to the bump 550 of the circuit board 300, and the second sub-pad SDP2 of the display pad portion DP.

Since the first passivation layer PAS1 and the second passivation layer PAS2 are not disposed in the pad area PA, the direct connection between the display pad portion DP and the bump 550 of the circuit board 300 might not be smooth due to the stepped portion of the pad area PA. The display device 10 may include the pad organic layer OPD and the pad structure PDS disposed in the pad area PA to compensate the stepped portion between the display area DA and the pad area PA, and the bump 550 of the circuit board 300 may be smoothly connected to the pad structure PDS. The circuit board 300 may be electrically connected to the display pad portion DP through the pad structure PDS.

In accordance with an embodiment of the present disclosure, the pad structure PDS may include the first pad layer PDS1, a second pad layer PDS2, and a third pad layer PDS3. The first to third pad layers PDS1, PDS2, and PDS3 and the layer disposed in the display area DA may include the same material and may be formed by the same process. In the display device 10, the pad structure PDS may be formed by performing the process performed in the display area DA also in the pad area PA without an additional process.

The first pad layer PDS1 may be disposed directly on the pad organic layer OPD. The first pad layer PDS1 may be in direct contact with the display pad portion DP exposed through the contact hole CNT of the pad organic layer OPD. For example, the first pad layer PDS1 may be in direct contact with the second sub-pad SPD2. The second pad layer PDS2 may be disposed directly on the first pad layer PDS1.

The first pad layer PDS1 and the second pad layer PDS2 may include the same material as those of the first bank layer BN1 and the second bank layer BN2 of the bank structure BNS disposed in the display area DA, respectively. The first pad layer PDS1 may include aluminum (Al) similarly to the first bank layer BN1, and the second pad layer PDS2 may include titanium (Ti) similarly to the second bank layer BN2. In the pad structure PDS, the first pad layer PDS1 and the second pad layer PDS2 may include different metal materials, so that the first pad layer PDS1 may be thicker than the second pad layer PDS2. The second pad layer PDS2 may include the tip TIP' protruding from the side surface of the first pad layer PDS1.

The third pad layer PDS3 may include the same material as that of the touch electrode TEL of the touch sensing layer TSU and may be disposed on the second pad layer PDS2. For example, similarly to the touch electrode TEL, the third pad layer PDS3 may include a single layer including molybdenum (Mo), titanium (Ti), copper (Cu), aluminum (Al), or indium tin oxide (ITO), or may have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO. In an embodiment in which the touch electrode TEL has a structure in which Ti/Al/Ti layers are stacked, the pad structure PDS may have a structure in which aluminum (Al) and titanium (Ti) are alternately stacked. The third pad layer PDS3 may be formed in substantially the same pattern as that of the second pad layer PDS2, and may form the tip TIP' of the pad structure PDS together with the second pad layer PDS2.

As described above, in the manufacturing process of the display device 10, the bank structure BNS may be formed by a deposition and etching process instead of a mask process, and at the same time, the first pad layer PDS1 and the second pad layer PDS2 disposed in the pad area PA may be formed. Further, the third pad layer PDS3 may be formed in the same process as the process of forming the touch electrode TEL of the touch sensing layer TSU. In the display device 10, the pad structure PDS including the same material as that of the layer disposed in the display area DA may be formed without a separate additional process, which may simplify the manufacturing process.

In particular, in the display area DA, each of the first passivation layer PAS1 and the second passivation layer PAS2 may include an organic insulating material, and the bank structure BNS and the touch electrode TEL may be layers disposed on the first passivation layer PAS1 and the second passivation layer PAS2, respectively. Thus, the pad structure PDS may be formed in a process performed after the process of forming the organic insulating material layer of the thin film transistor layer TFTL in the pad area PA of the display device 10. Since the process of forming the organic insulating material layer is not performed after the pad structure PDS is formed, it is possible to remove an obstacle for electrical connection with the circuit board 300 due to the organic material remaining on the pad structure PDS at the outer portion of the display panel 100. Further, since the process of forming the organic insulating material layers of the thin film transistor layer TFTL, and the first dam DAM1 and the second dam DAM2 is performed before the pad structure PDS is formed, it is possible to sufficiently compensate the stepped portion between the display area DA and the pad area PA by forming the pad organic layer OPD disposed on the display pad portion DP.

The display device 10, according to an embodiment of the present disclosure, may utilize a pad structure PDS that may be formed without an additional process, and a conductive adhesive member disposed between the pad structure PDS and the bump 550 during the adhesion of the circuit board 300 may be omitted. In addition, the layers of the pad structure PDS may include titanium (Ti) or aluminum (Al), so that the contact resistance of the circuit board 300 with the bump 550 may be easily controlled.

Hereinafter, a manufacturing process of the display device 10, according to an embodiment of the present disclosure, will be described with reference to other drawings.

FIGS. 11 to 18 are cross-sectional views sequentially illustrating a display area portion during a manufacturing process of a display device according to an embodiment of the present disclosure.

FIGS. 11 to 18 schematically illustrate a process of forming the light emitting elements ED and the bank structure BNS as the light emitting element layer EML of the display device 10. Hereinafter, the description of the process of forming the layers in the manufacturing process of the display device 10 will be omitted, as it may be assumed to be substantially the same as is descried elsewhere within the present disclosure, and the formation order of the layers will be described.

Figure 11:
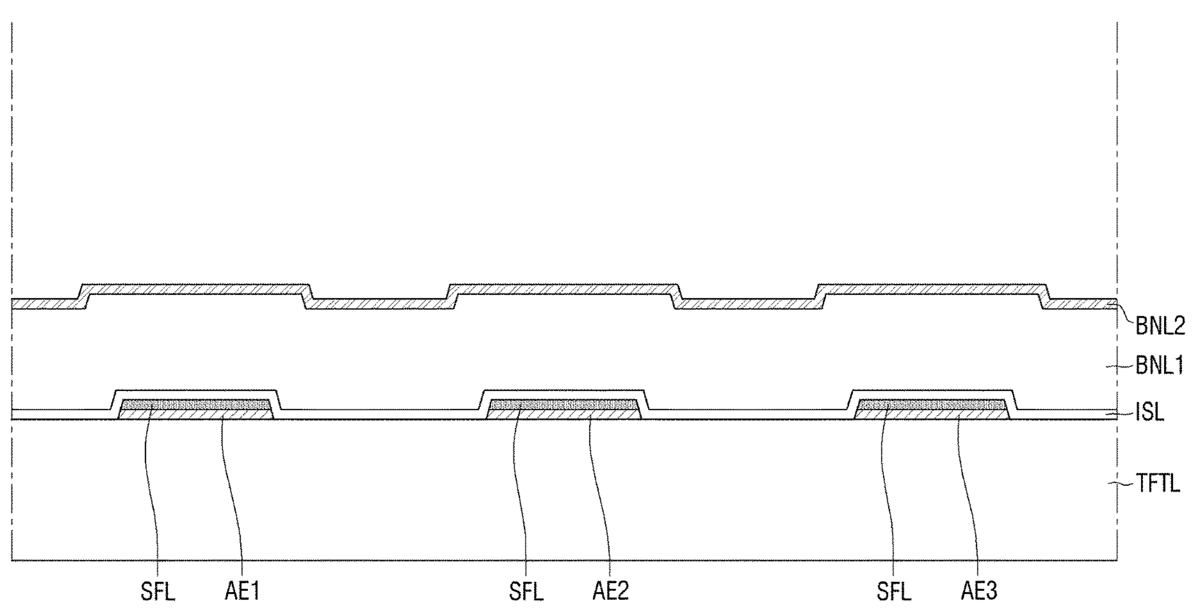
FIGS. 11 to 18 are cross-sectional views sequentially illustrating a display area portion during a manufacturing process of a display device according to an embodiment of the present disclosure.

Referring to FIG. 11, the plurality of pixel electrodes AE1, AE2, and AE3, the sacrificial layer SFL, the inorganic insulating layer ISL, and the plurality of bank material layers BNL1 and BNL2 are formed on the thin film transistor layer TFTL.

The thin film transistor layer TFTL may be disposed on the substrate SUB, and the structure of the thin film transistor TFTL is the same as described above with reference to FIG. 6. A detailed description thereof will be omitted as it may be assumed to be substantially the same as is descried elsewhere within the present disclosure.

The plurality of pixel electrodes AE1, AE2, and AE3 may be spaced apart from each other on the thin film transistor layer TFTL. The pixel electrodes AE1, AE2, and AE3 may include the first pixel electrode AE1, the second pixel electrode AE2, and the third pixel electrode AE3 of the different light emitting elements ED1, ED2, and ED3. The first to third pixel electrodes AE1, AE2, and AE3 may be spaced apart from each other on the thin film transistor layer TFTL.

The sacrificial layer SFL may be disposed on the pixel electrodes AE1, AE2, and AE3. The sacrificial layer SFL may be disposed on the pixel electrodes AE1, AE2, and AE3, and then may be partially removed in a subsequent process to form a space in which the light emitting layers EL1, EL2, and EL3 are disposed. The sacrificial layer SFL may prevent the contact between the top surfaces of the pixel electrodes AE1, AE2, and AE3 and the inorganic insulating layer ISL, and the sacrificial layer SFL may be removed to form a space between the pixel electrodes AE1, AE2, and AE3 and the inorganic insulating layer ISL. In an embodiment of the present disclosure, the sacrificial layer SFL may include an oxide semiconductor. For example, the sacrificial layer SFL may include indium-gallium-zinc oxide (IGZO), zinc-tin oxide (ZTO), and/or indium-tin oxide (ITO).

The inorganic insulating layer ISL and the bank material layers BNL1 and BNL2 may be disposed on the sacrificial layer SFL. The inorganic insulating layer ISL may entirely cover the sacrificial layer SFL and the thin film transistor layer TFTL, and the plurality of bank material layers BNL1 and BNL2 may entirely cover the inorganic insulating layer ISL. The bank material layers BNL1 and BNL2 may include the first bank material layer BNL1 and the second bank material layer BNL2 that are sequentially stacked. The first bank material layer BNL1 may be disposed directly on the inorganic insulating layer ISL, and the second bank material layer BNL2 may be disposed on the first bank material layer BNL1. The bank material layers BNL1 and BNL2 may be partially etched in a subsequent process to form the bank layers BN1 and BN2 of the bank structure BNS illustrated in FIG. 6, respectively. The first bank material layer BNL1 and the second bank material layer BNL2 may include different metal materials to form the first bank layer BN1 and the second bank layer BN2, respectively.

Figure 12:
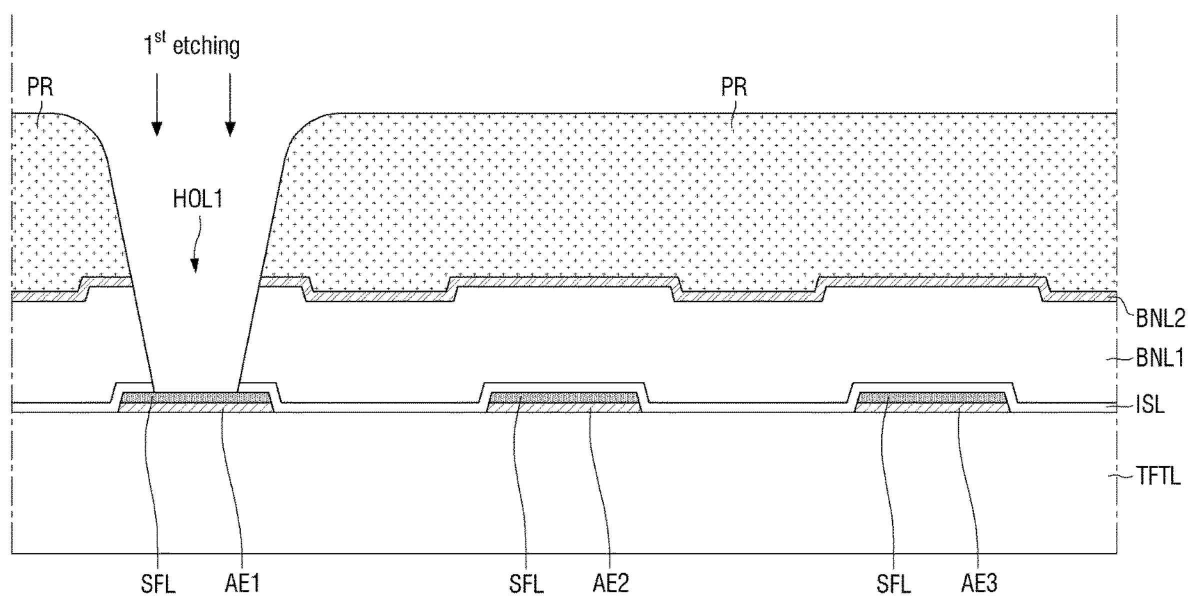

Next, referring to FIG. 12, photoresists PR may be formed on the bank material layers BNL1 and BNL2, and a first etching process ($1^{st}$ etching) for etching some of the bank material layers BNL1 and BNL2 using the photoresist PR as a mask is performed to form a first hole HOL1.

The photoresists PR may be disposed on the bank material layers BNL1 and BNL2 to be spaced apart from each other. The photoresists PR might not overlap the first pixel electrode AE1 on the second bank material layer BNL2, and may expose portions of the bank material layers BNL1 and BNL2 at least partially overlapping the first pixel electrode AE1.

In an embodiment of the present disclosure, the first etching process ($1^{st}$ etching) may be performed as dry etching. Since the first etching process ($1^{st}$ etching) is performed as a dry etching process, the bank material layers BNL1 and BNL2 including different materials may be anisotropically etched. In this process, the bank material layers BNL1 and BNL2 and a part of the inorganic insulating layer ISL may be etched together to partially expose the sacrificial layer SFL disposed thereunder. The first hole HOL1 may be formed in the regions at least partially overlapping the pixel electrodes AE1, AE2, and AE3, and the first hole HOL1 may form the openings OPE1, OPE2, and OPE3 of the bank structure BNS.

Figure 13:
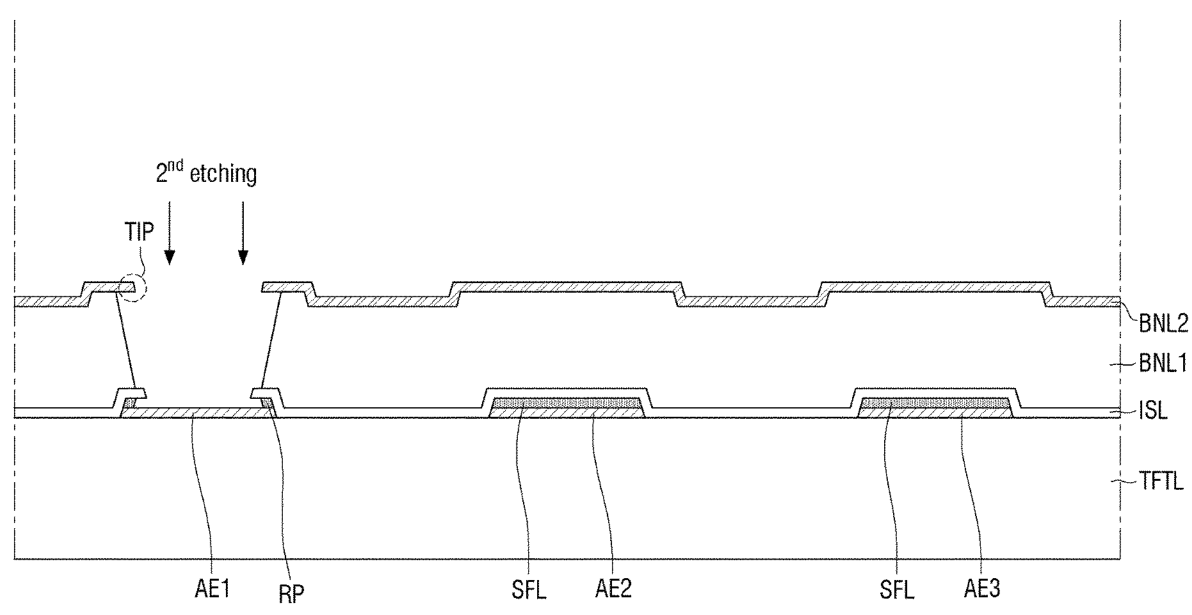

Next, referring to FIG. 13, a second etching process ($2^{nd}$ etching) for removing the sacrificial layer SFL disposed on the first pixel electrode AE1 is performed. In an embodiment of the present disclosure, the sacrificial layer SFL may include an oxide semiconductor layer, and the second etching process ($2^{nd}$ etching) may be performed as a wet etching process. In this process, the inner sidewall of the first hole HOL1 may be isotropically etched by the removal of the sacrificial layer SFL. Among the plurality of bank material layers BNL1 and BNL2, the first bank material layer BNL1 may have an etching rate that is faster than those of other bank material layers, and the second bank material layer BNL2 may have the tip TIP protruding more than the lateral side of the first bank material layer BNL1. On the lateral side of the first bank material layer BNL1, the undercut may be formed under the tip TIP of the second bank material layer BNL2. The first hole HOL1 may form the first opening OPE1 or the first emission area EA1 by the second etching process ($2^{nd}$ etching).

A part of the sacrificial layer SFL exposed by the first hole HOL1 and a portion between the inorganic insulating layer ISL and the first pixel electrode AE1 may be removed. However, the sacrificial layer SFL might not be completely removed, and may remain as the partial residual pattern RP between the inorganic insulating layer ISL and the first pixel electrode AE1. As a portion remaining after the sacrificial layer SFL is removed, a space may be formed between the first pixel electrode AE1 and the inorganic insulating layer ISL disposed thereon. In a subsequent process, the first light emitting layer EL1 disposed on the first pixel electrode AE1 may fill the space.

Figure 14:
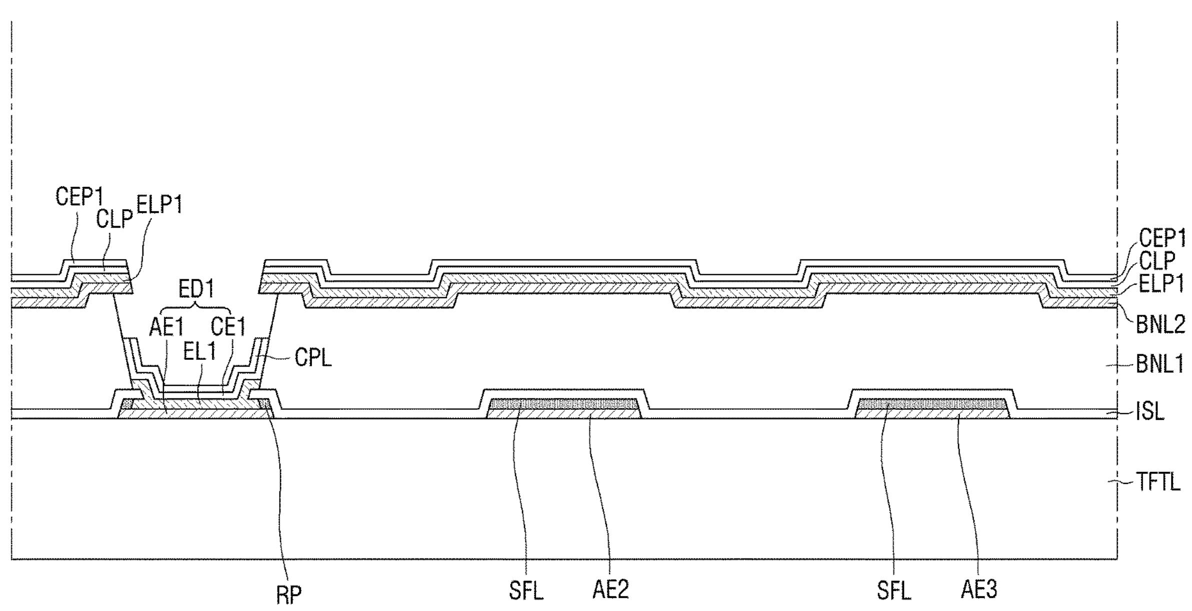

Next, referring to FIG. 14, the first light emitting element ED1 is formed by depositing the first light emitting layer EL1, the first common electrode CE1, and the capping layer CPL on the first pixel electrode AE1. The first light emitting layer EL1 and the first common electrode CE1 may be formed in the first opening OPE1, and in the deposition process, the materials forming the first light emitting layer EL1 and the first common electrode CE1 may also be deposited on the second bank material layers BNL2 to form a plurality of patterns. For example, some of the materials may be deposited on the second bank material layer BNL2 to form the first organic pattern ELP1 and the first electrode pattern CEP1. A part of the capping layer CPL may be disposed in the first opening OPE1 and may cover the first light emitting element ED1, and another part thereof may be disposed on the second bank material layer BNL2 to form the first organic pattern ELP1 and the first electrode pattern CEP1. The description of the structure of the first light emitting layer EL1, the first common electrode CE1, the first organic pattern ELP1, and the first electrode pattern CEP1 is the same as described above.

The first light emitting layer EL1 and the first common electrode CE1 may be formed by a deposition process. The deposition of the material might not be smooth in the first opening OPE1 by the tip TIP of the second bank material layer BNL2. Since, however, the materials of the first light emitting layer EL1 and the first common electrode CE1 are deposited in an inclined direction rather than in a direction perpendicular to the top surface of the substrate, they may be deposited even in the region hidden by the tip TIP of the first bank material layer BNL1.

For example, the deposition process of forming the first light emitting layer EL1 may be performed such that the materials are deposited in a direction not perpendicular to the top surface of the first pixel electrode AE1, for example, in a direction inclined at a first angle. In an embodiment of the present disclosure, in the process of forming the light emitting layers EL1, EL2, and EL3, the deposition of the material may be performed at an angle of 45° to 50° inclined from the top surfaces of the pixel electrodes AE1, AE2, and AE3. The first light emitting layer EL1 may fill a space between the first pixel electrode AE1 and the inorganic insulating layer ISL, and may also be formed in the region hidden by the tip TIP of the second bank material layer BNL2. For example, the first light emitting layer EL1, may be partially disposed on the side surface of the first bank material layer BNL1, which is the region hidden by the tip TIP.

The deposition process of forming the first common electrode CE1 may be performed such that the materials are deposited in a direction not perpendicular to the top surface of the first pixel electrode AE1, for example, in a direction inclined at a second angle. In an embodiment of the present disclosure, in the process of forming the common electrodes CE1, CE2, and CE3, the deposition of the material may be performed at an angle of 30° or less inclined from the top surfaces of the pixel electrodes AE1, AE2, and AE3. The first common electrode CE1 may be disposed on the first light emitting layer EL1 and may also be formed in the region hidden by the tip TIP of the second bank material layer BNL2. For example, the first common electrode CE1 may be partially disposed on the side surface of the first bank material layer BNL1, which is the region hidden by the tip TIP.

The deposition process of forming the common electrodes CE1, CE2, and CE3 may be performed at an angle inclined to be relatively close to a horizontal direction compared to the deposition process of forming the light emitting layers EL1, EL2, and EL3. Accordingly, the common electrodes CE1, CE2, and CE3 may be in contact with the side surface of the first bank layer BN1 or the first bank material layer BNL1 in larger areas compared to the light emitting layers EL1, EL2, and EL3. Alternatively, the common electrodes CE1, CE2, and CE3 may be deposited to higher positions on the side surface of the first bank layer BN1 or the first bank material layer BNL1 compared to the light emitting layers EL1, EL2, and EL3. The different common electrodes CE1, CE2, and CE3 may be electrically connected to each other while being in contact with the first bank layer BN1 or the first bank material layer BNL1 having high electrical conductivity.

Figure 15:
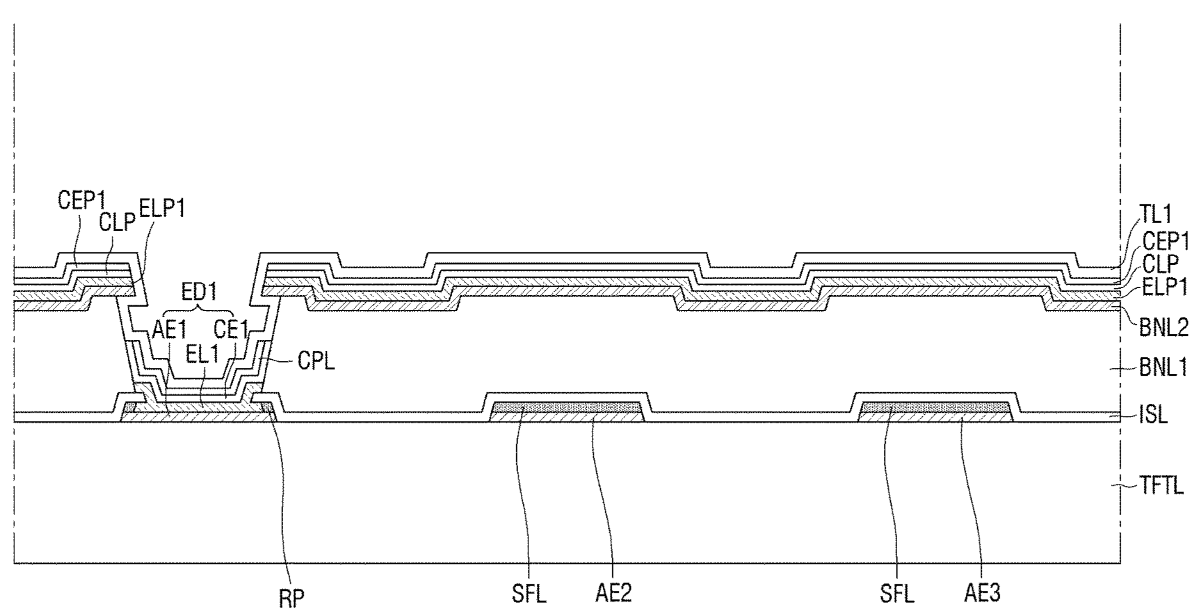

Next, referring to FIG. 15, the first inorganic layer TL1 covering the first light emitting element ED1 and the capping layer CPL is formed. Unlike the light emitting layers EL1, EL2, and EL3 and the common electrodes CE1, CE2, and CE3, the first inorganic layer TL1 may be formed by a chemical vapor deposition (CVD) process, and the first inorganic layer TL1 may form a uniform film regardless of the stepped portion of the deposited portion. The first inorganic layer TL1 may completely cover the outer surfaces of the first light emitting element ED1, the bank material layers BNL1 and BNL2, and the capping layer CPL. In particular, the first inorganic layer TL1 may also be deposited under the tip TIP of the second bank material layer BNL2.

Figure 16:
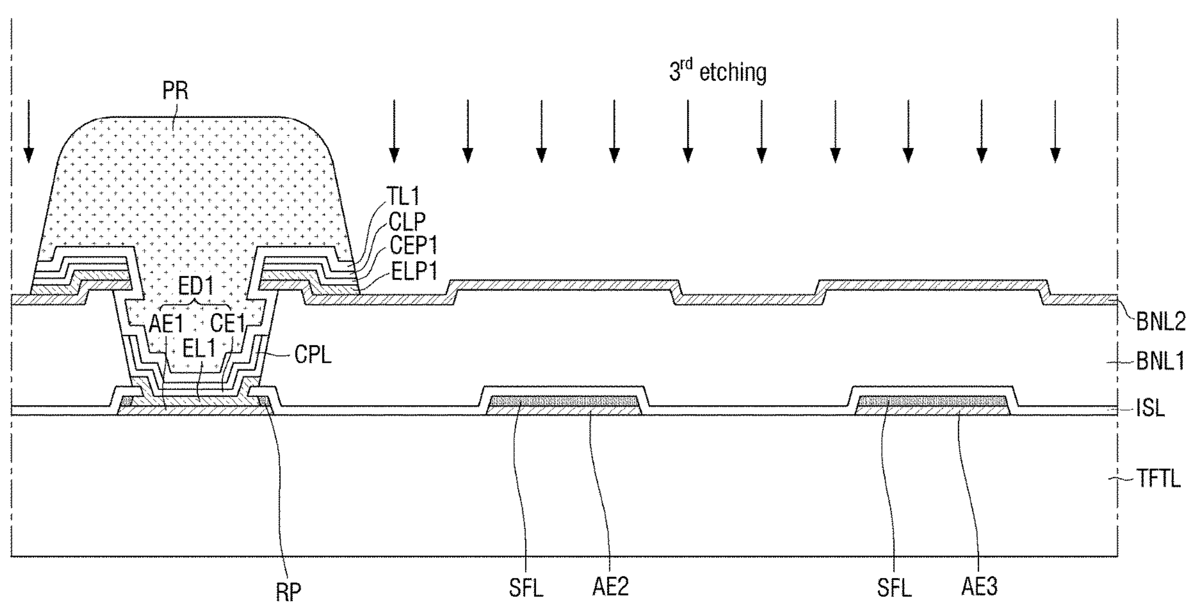

Next, referring to FIG. 16, the photoresist PR is formed on the first inorganic layer TL1, and a third etching process ($3^{rd}$ etching) of partially removing the first organic pattern ELP1, the first electrode pattern CEP1, the capping layer CPL, and the first inorganic layer TL1 disposed on the bank material layers BNL1 and BNL2 is performed.

In this process, the photoresist PR may at least partially overlap the first opening OPE1 or the first light emitting element ED1. The first organic pattern ELP1, the first electrode pattern CEP1, the capping pattern CLP, and the first inorganic layer TL1 disposed on the bank material layers BNL1 and BNL2 may be completely removed except the periphery of the first light emitting element ED1 or the first opening OPE1. In the process, the region of the second bank material layer BNL2 except the periphery of the first light emitting element ED1 or the first opening OPE1 may be exposed. In an embodiment of the present disclosure, the third etching process ($3^{rd}$ etching) for removing the first inorganic layer TL1 disposed on the bank material layers BNL1 and BNL2 may be performed as a dry etching process using a fluorine (F)-based etchant.

Figure 17:
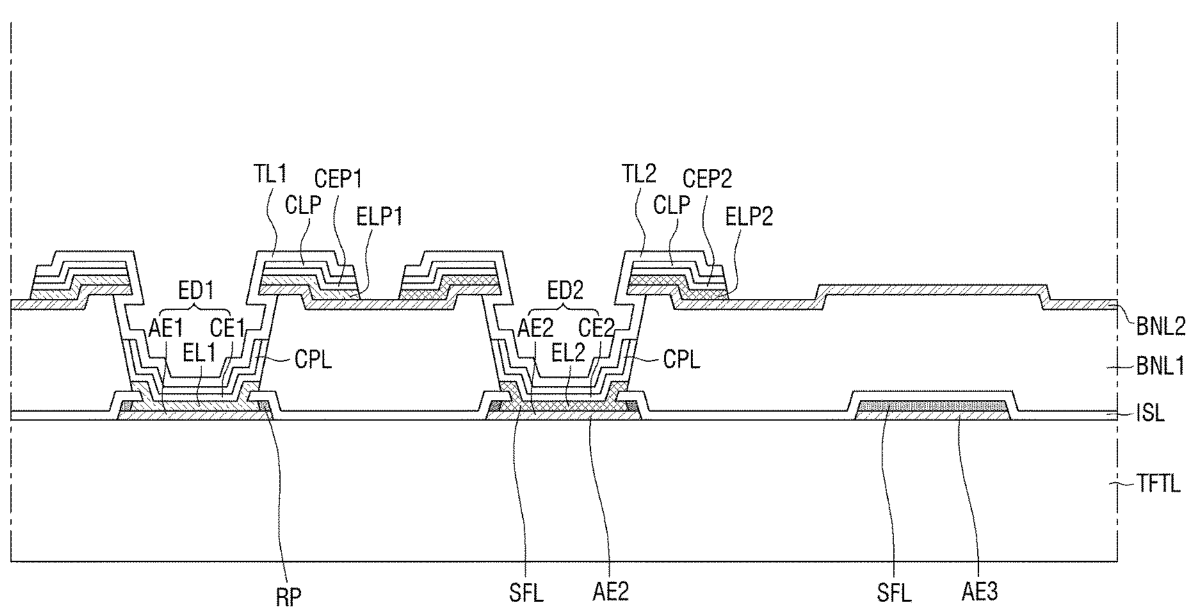
Figure 18:
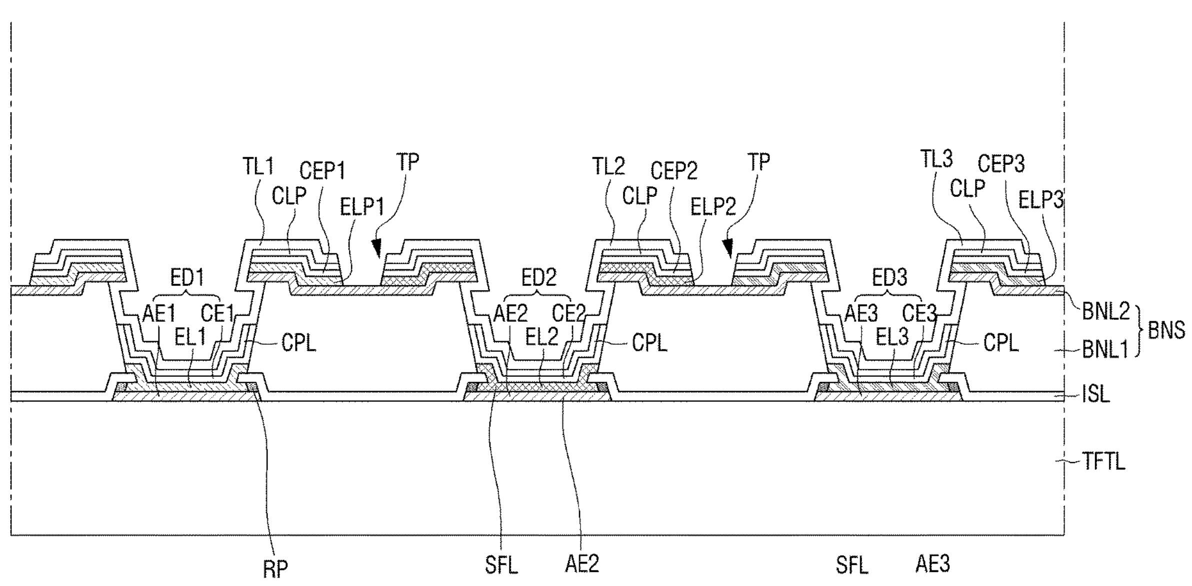

By the above processes, the first light emitting element ED1, and the first inorganic layer TL1 covering the first light emitting element ED1, the first organic pattern ELP1, the first electrode pattern CEP1, and the capping layer PL may be formed. Referring to FIGS. 17 and 18, the second light emitting element ED2, the third light emitting element ED3, the second and third organic patterns ELP2 and ELP3, the second and third electrode patterns CEP2 and CEP3, the second inorganic layer TL2, and the third inorganic layer TL3 may be formed by repeating processes similar to the above-described processes.

Next, the thin film encapsulation layer TFEL may be formed by forming the second encapsulation layer TFE2 and the third encapsulation layer TFE3 on the first encapsulation layers TFE1 and the bank structure BNS, and the touch sensing layer TSU, the light blocking layer BM, the color filter layer CFL, and the overcoat layer OC may be formed, thereby manufacturing the display device 10. In the above, the manufacturing process of the display area DA of the display device 10 has been described.

FIGS. 19 to 23 are cross-sectional views illustrating a pad area portion during the manufacturing process of a display device according to an embodiment of the present disclosure.

FIGS. 19 to 23 schematically illustrate a process of forming the pad organic layer OPD and the pad structures PDS of the display device 10. Hereinafter, the description of the process of forming the layers in the manufacturing process of the display device 10 will be omitted, as it may be assumed to be substantially the same as is descried elsewhere within the present disclosure, and the formation order of the layers will be described.

Figure 19:
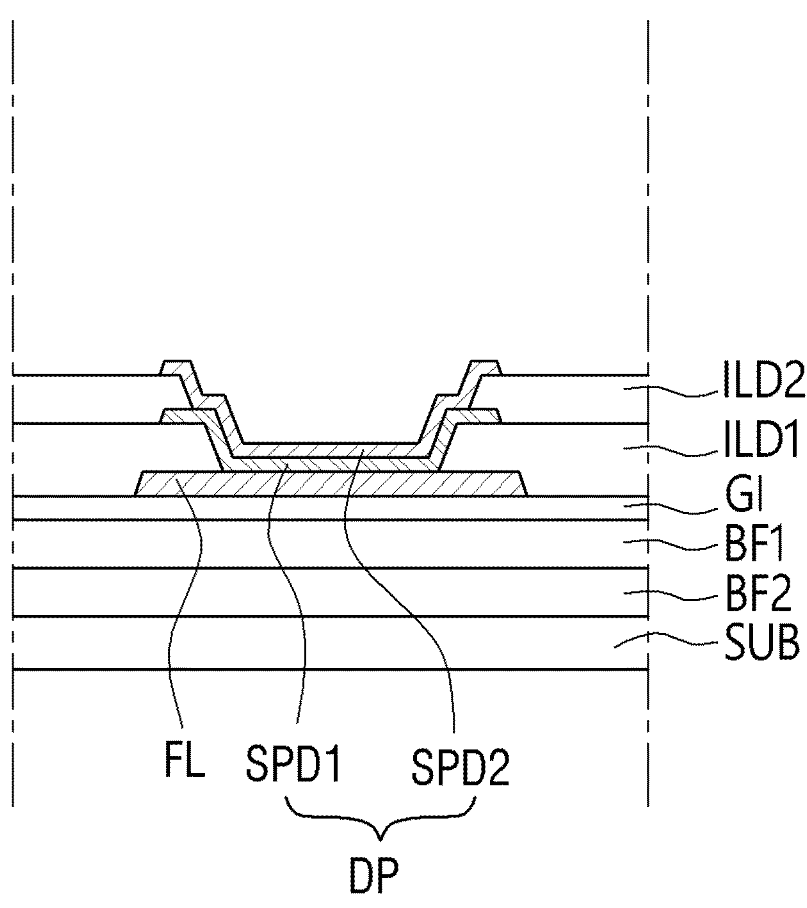
FIGS. 19 to 23 are cross-sectional views illustrating a pad area portion during the manufacturing process of a display device according to an embodiment of the present disclosure.

Referring to FIG. 19, the display pad portions DP are formed in the pad area PA of the display device 10, and the first passivation layer PAS1 and the second passivation layer PAS2 disposed thereon are removed. The first passivation layer PAS1 and the second passivation layer PAS2 may be formed on the entire substrate SUB in the process of forming the thin film transistor layer TFTL, and then may be removed in the non-display area NDA and the pad area PA. Accordingly, the display pad portions DP may be exposed in the pad area PA.

Figure 20:
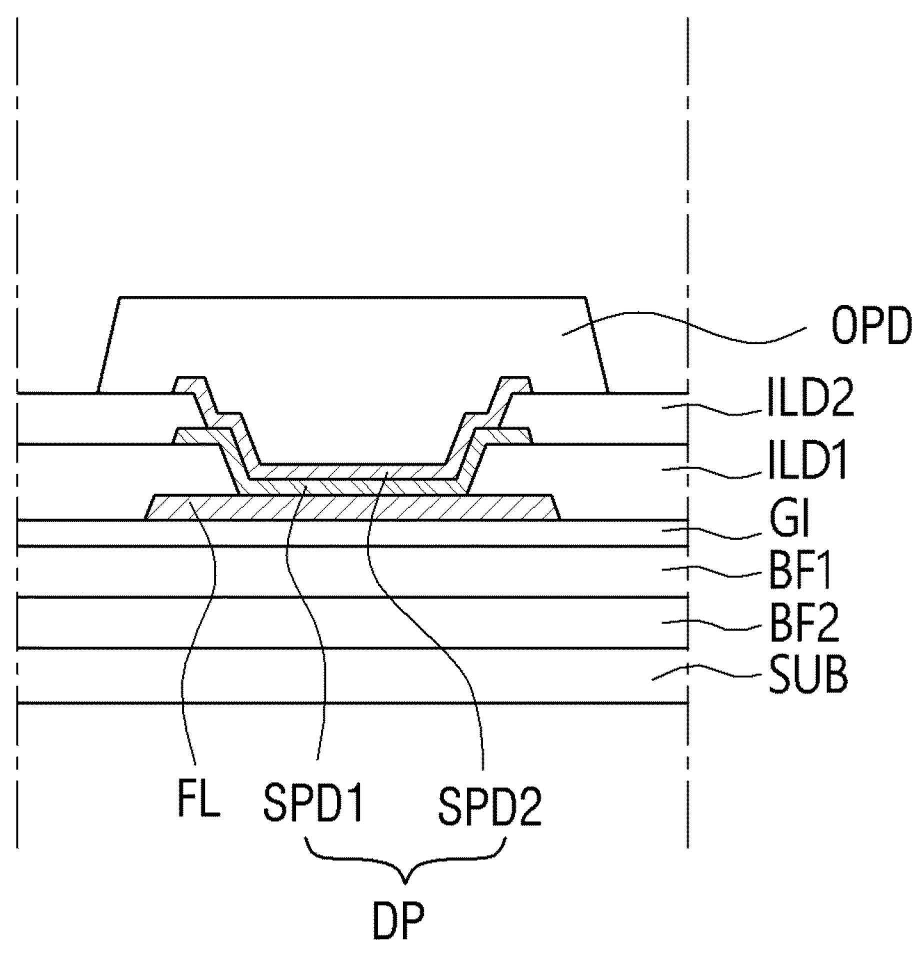
Figure 21:
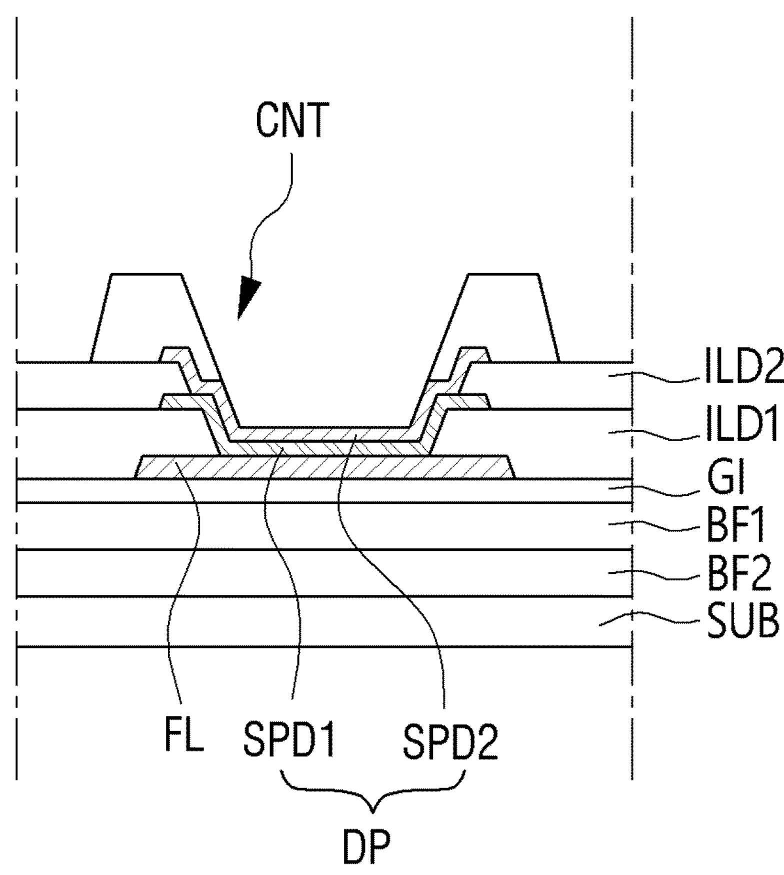

Next, referring to FIGS. 20 and 21, the pad organic layer OPD is formed on the display pad portion DP. The pad organic layer OPD may be formed in the same process as the process of forming the third sub-dam SDAM3 of the second dam DAM2 described above. However, the disclosure is not necessarily limited thereto, and the pad organic layer OPD may be formed in the same process as the process of forming the first passivation layer PAS1 or the second passivation layer PAS2. Further, the pad organic layer OPD, which is a structure in which a plurality of layers are stacked instead of a single layer, may have a shape similar to that of the first dam DAM1 and the second dam DAM2. The pad organic layer OPD may cover the display pad portion DP, and the contact hole CNT exposing a part of the top surface of the display pad portion DP may be formed.

Figure 22:
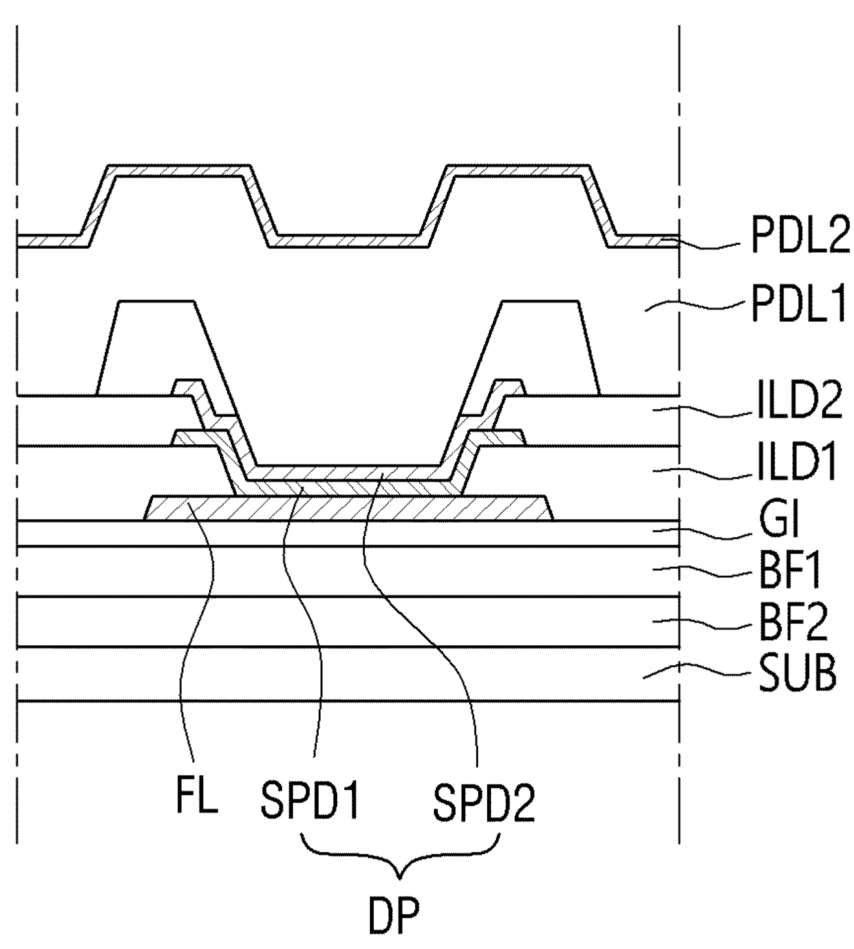
Figure 23:
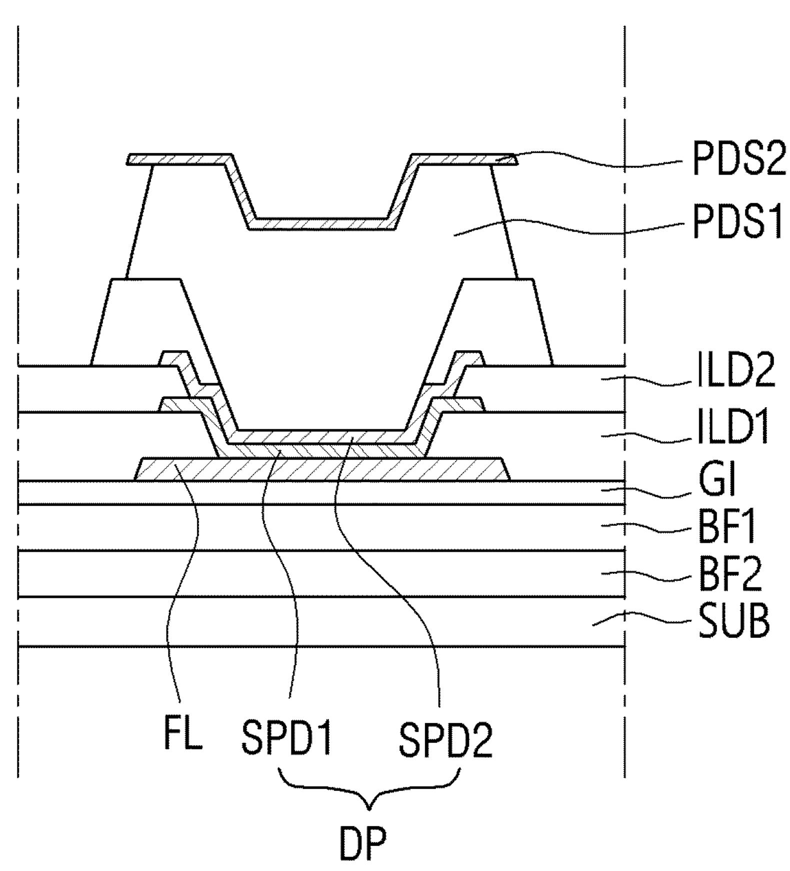

Next, referring to FIGS. 22 and 23, the first pad layer PDS1 and the second pad layer PDS2 are formed on the pad organic layer OPD. The first pad layer PDS1 and the second pad layer PDS2 may be formed in the same process as the process of forming the first bank layer BN1 and the second bank layer BN2 of the display area DA, respectively. Similarly to the above description, the first pad layer PDS1 and the second pad layer PDS2 may be formed by a process of sequentially forming the first pad material layer PDL1 and the second pad material layer PDL2 on the pad organic layer OPD and then etching them. The first pad material layer PDL1 may be in direct contact with the second sub-pad SPD2 exposed through the contact hole CNT of the pad organic layer OPD, and the second pad material layer PDL2 may be disposed directly on the first pad material layer PDL1. The first pad material layer PDL1 and the first bank material layer BNL1 disposed in the display area DA may include the same material and may be formed in the same process. The second pad material layer PDL2 and the second bank material layer BNL2 disposed in the display area DA may include the same material and may be formed in the same process.

In the process of forming the first hole HOL1 of the bank structure BNS or other holes, the first pad material layer PDL1 and the second pad material layer PDL2 may also be etched together to form the first pad layer PDS1 and the second pad layer PDS2, respectively. Since the first pad material layer PDL1 and the second pad material layer PDL2 include different materials, the second pad layer PDS2 may include the tip protruding from the side surface of the first pad layer PDS1 after the etching.

Next, in the process of forming the touch sensing layer TSU in the display area DA, the third pad layer PDS3 may be formed on the second pad layer PDS2 to form the pad structure PDS.

Hereinafter, various embodiments of the display device 10 will be described with reference to other drawings.

Figure 24:
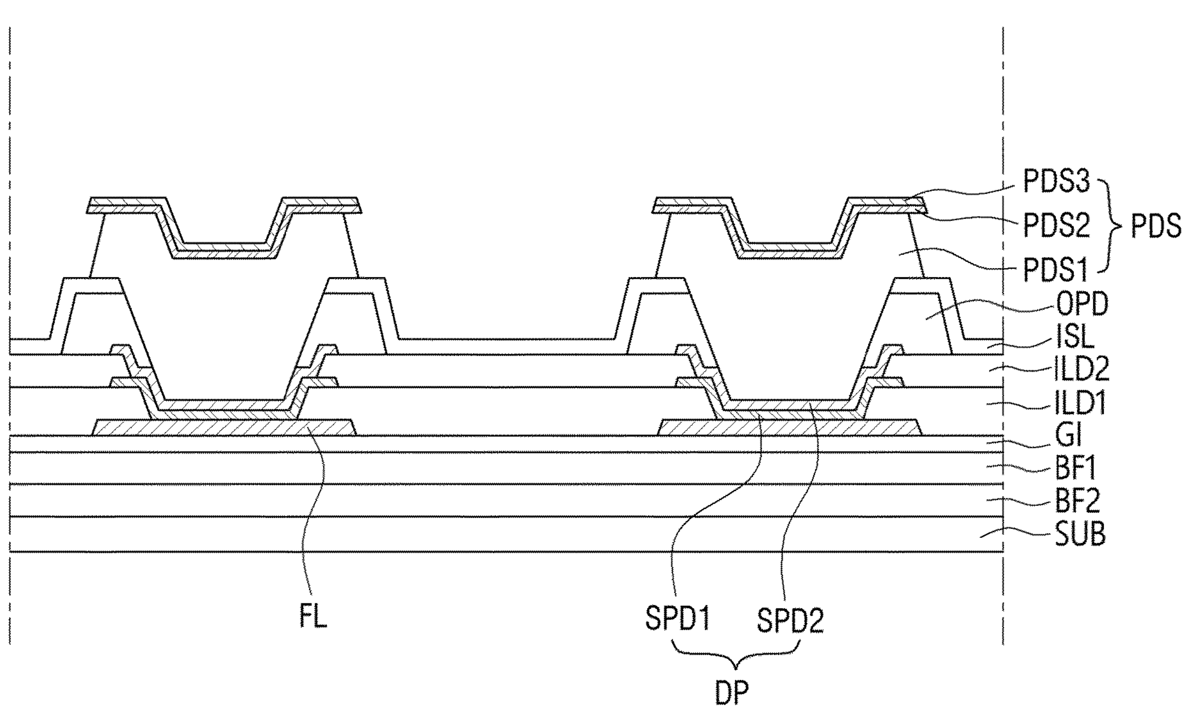
FIGS. 24 to 26 are cross-sectional views illustrating pad portions disposed in the pad area of a display device according to an embodiment of the present disclosure.
Figure 25:
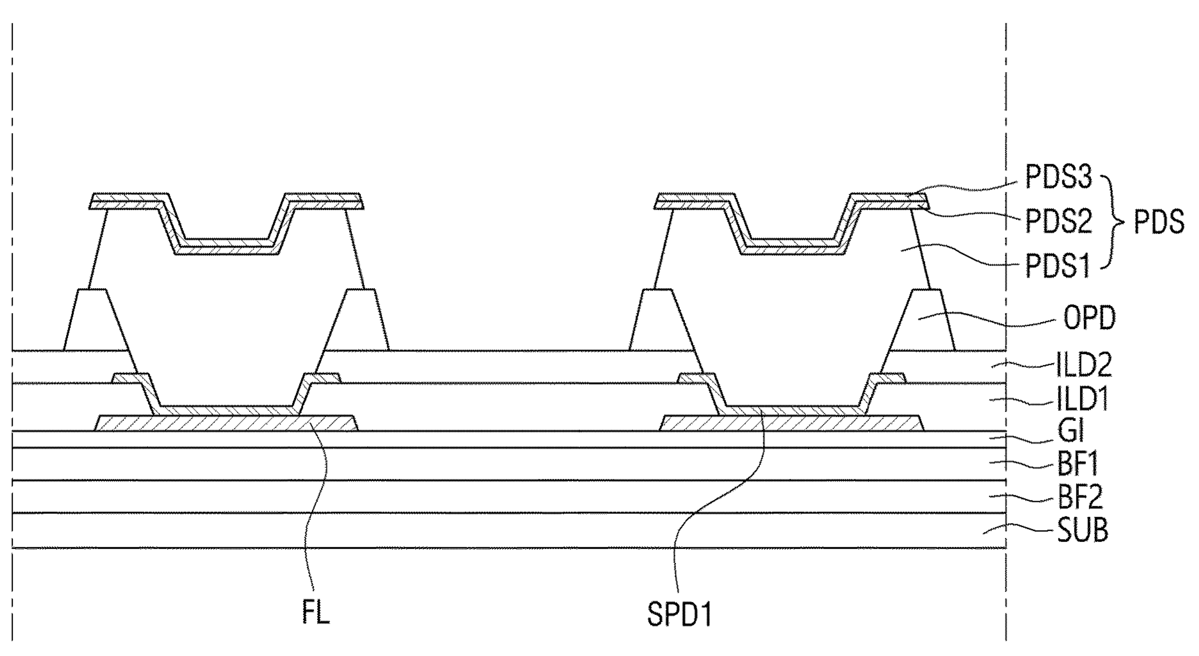
Figure 26:
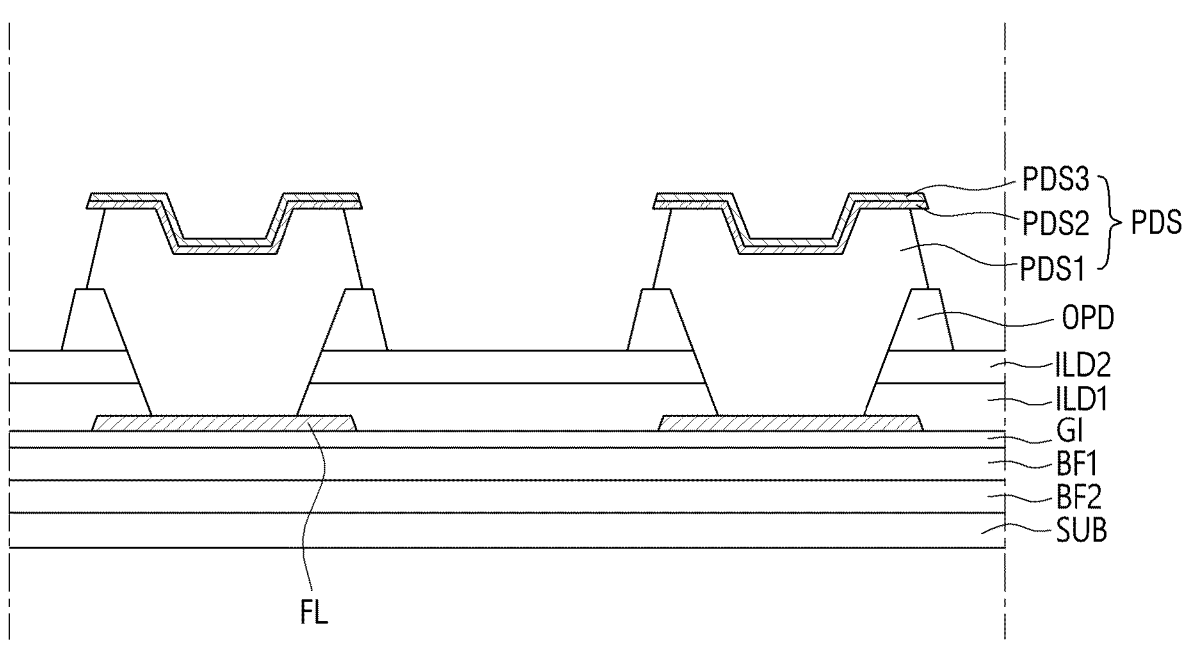

FIGS. 24 to 26 are cross-sectional views illustrating pad portions disposed in the pad area of a display device according to an embodiment of the present disclosure.

Referring to FIG. 24, in the display device 10, according to an embodiment of the present disclosure, the inorganic insulating layer ISL disposed in the display area DA may also be disposed in the pad area PA. The inorganic insulating layer ISL, which is a layer disposed under the bank structure BNS in the display area DA, may partially cover the pixel electrode AE. Similarly, the inorganic insulating layer ISL may extend to the pad area PA of the non-display area NDA and may be disposed between the pad organic layer OPD and the pad structure PDS. In the pad area PA, the inorganic insulating layer ISL may be disposed directly disposed on the pad organic layer OPD and the second interlayer insulating layer ILD2, and the first pad layer PDS1 of the pad structure PDS may be disposed directly on the inorganic insulating layer ISL. The contact hole CNT of the pad organic layer OPD may also penetrate the inorganic insulating layer ISL.

In the display device 10, the inorganic insulating layer ISL of the display area DA extends to the pad area PA to be also disposed on the pad organic layer OPD, so that it is possible to further compensate the stepped portion between the display area DA and the pad area PA.

Referring to FIGS. 25 and 26, in the display device 10, according to an embodiment of the present disclosure, the display pad portion DP may be omitted. In the display device 10 of FIG. 25, the second sub-pad SPD2 of the display pad portion PD may be omitted, and the first pad layer PDS1 of the pad structure PDS may be in direct contact with the first sub-pad SDP1. In the display device 10 of FIG. 26, the display pad portion PD may be omitted, and the first pad layer PDS1 of the pad structure PDS may be in direct contact with the fan-out line FL.

The display device 10 may include the pad structure PDS and the pad organic layer OPD to implement electrical connection between the fan-out line FL and the bump 550 of the circuit board 300. Accordingly, in the display device 10, the display pad portion DP formed in the thin film transistor layer TFTL may be partially omitted or completely removed, and the pad structure PDS may be directly connected to the fan-out line FL. Accordingly, in the display device 10, restrictions on securing a space for disposing the display pad portion DP in the pad area PA may be reduced.

In concluding the detailed description, those skilled in the art will appreciate that many variations and modifications can be made to the preferred embodiments without substantially departing from the principles of the present disclosure.

What is claimed is:

1. A display device, comprising:

a display area and a pad area disposed on one side of the display area;

pixel electrodes disposed in the display area and spaced apart from each other;

an inorganic insulating layer disposed in the display area and at least partially disposed on the pixel electrodes;

a bank structure disposed on the inorganic insulating layer and comprising a plurality of openings at least partially overlapping the pixel electrodes;

a pad structure disposed in the pad area and electrically connected to a fan-out line disposed in the pad area and the display area;

a plurality of light emitting layers disposed on the pixel electrodes and disposed in the plurality of openings of the bank structure; and a plurality of common electrodes disposed on the plurality of light emitting layers and disposed in the plurality of openings of the bank structure, wherein the bank structure comprises a first bank layer and a second bank layer disposed on the first bank layer and including a metal material that is different from that of the first bank layer, wherein the pad structure comprises a first pad layer including the same metal material as the first bank layer, and a second pad layer disposed on the first pad layer and including the same metal material as the second bank layer, and wherein each of the second bank layer and the second pad layer comprises a tip protruding from a sidewall of the first bank layer or a sidewall of the first pad layer.

2. The display device of claim 1, wherein the first bank layer and the first pad layer includes aluminum (Al), and wherein the second bank layer and the second pad layer includes titanium (Ti).

3. The display device of claim 1, further comprising:

a plurality of dams at least partially surrounding the display area and comprising a plurality of stacked sub-dams including an organic insulating material; and a pad organic layer including a same material as any one of the plurality of stacked sub-dams and disposed under the pad structure.

4. The display device of claim 3, wherein the first pad layer is disposed directly on the pad organic layer, and wherein the first pad layer is in direct contact with the fan-out line exposed through a contact hole penetrating the pad organic layer.

5. The display device of claim 3, further comprising a first sub-pad disposed in the pad area and in direct contact with the fan-out line and at least partially overlapping the pad organic layer, wherein the first pad layer is disposed directly on the pad organic layer and is in direct contact with the first sub-pad exposed through a contact hole penetrating the pad organic layer.

6. The display device of claim 3, further comprising:

a first sub-pad disposed in the pad area in direct contact with the fan-out line, and at least partially overlapping the pad organic layer; and a second sub-pad disposed on the first sub-pad and in direct contact with the first sub-pad, wherein the first pad layer is disposed directly on the pad organic layer and is in direct contact with the second sub-pad exposed through a contact hole penetrating the pad organic layer.

7. The display device of claim 3, wherein the inorganic insulating layer extends to the pad area and is disposed on the pad organic layer, and wherein the first pad layer is disposed directly on the inorganic insulating layer.

8. The display device of claim 1, further comprising:

a thin film encapsulation layer comprising a first encapsulation layer disposed on the bank structure, a second encapsulation layer disposed on the first encapsulation layer, and a third encapsulation layer disposed on the second encapsulation layer; and a touch layer disposed on the thin film encapsulation layer and comprising a plurality of touch insulating layers and a touch electrode disposed between the plurality of touch insulating layers, wherein the pad structure further comprises a third pad layer disposed on the second pad layer and disposed on a same layer as the touch electrode.

9. The display device of claim 8, further comprising:

a light blocking layer disposed on the touch layer at least partially overlapping the touch electrode and comprising a plurality of opening holes at least partially overlapping the plurality of openings of the bank structure; and a plurality of color filters respectively disposed in the plurality of opening holes on the light blocking layer.

10. The display device of claim 1, wherein each of the plurality of common electrodes is in direct contact with a side surface of the first bank layer.

11. The display device of claim 1, further comprising:

a plurality of organic patterns disposed on the second bank layer and surrounding the plurality of openings of the bank structure and including a same material as the plurality of light emitting layers; and a plurality of electrode patterns disposed on the plurality of organic patterns and including a same material as the plurality of common electrodes.

12. The display device of claim 11, further comprising a plurality of inorganic layers disposed on sidewalls of the plurality of openings of the bank structure and disposed on the plurality of common electrodes and the plurality of electrode patterns, wherein the plurality of inorganic layers different from each other are spaced apart from each other on the second bank layer.

13. The display device of claim 1, wherein the inorganic insulating layer is not in contact with a top surface of the pixel electrodes, and wherein a part of the plurality of light emitting layers is disposed between the pixel electrodes and the inorganic insulating layer.

14. The display device of claim 13, further comprising a residual pattern disposed between the pixel electrodes and the inorganic insulating layer.

15. An electronic device comprising a display device, the display device comprising:

a substrate comprising a display area and a pad area disposed on one side of the display area;

a buffer layer disposed on the substrate, in the display area, and the pad area;

a semiconductor layer disposed on the buffer layer in the display area;

a gate insulating layer disposed on the semiconductor layer, in the display area, and the pad area;

a gate electrode disposed on the gate insulating layer and disposed in the display area, and a fan-out line disposed across the display area and the pad area;

an interlayer insulating layer disposed on the gate electrode and the fan-out line;

a first connection electrode disposed on the interlayer insulating layer in the display area and electrically connected to the semiconductor layer, and a display pad portion disposed on the interlayer insulating layer in the pad area and electrically connected to the fan-out line;

a pad organic layer comprising a first passivation layer disposed on the first connection electrode in the display area, a second passivation layer disposed on the first passivation layer in the display area, and a contact hole disposed on the display pad portion in the pad area and exposing a part of a top surface of the display pad portion;

a pixel electrode disposed on the second passivation layer in the display area;

an inorganic insulating layer disposed on the second passivation layer and at least partially overlapping the pixel electrode;

a bank structure disposed on the inorganic insulating layer in the display area and comprising an opening at least partially overlapping the pixel electrode, and a pad structure disposed on the pad organic layer in the pad area and in contact with the display pad portion;

a light emitting layer disposed on the pixel electrode in the opening of the bank structure; and a common electrode disposed on the light emitting layer, wherein the bank structure comprises a first bank layer and a second bank layer disposed on the first bank layer and including a metal material that is different from that of the first bank layer, wherein the pad structure comprises a first pad layer including the same metal material as the first bank layer, and a second pad layer disposed on the first pad layer and including the same metal material as the second bank layer, and wherein each of the second bank layer and the second pad layer comprises a tip protruding from a sidewall of the first bank layer or a sidewall of the first pad layer.

16. The electronic device of claim 15, further comprising:

a thin film encapsulation layer comprising a first encapsulation layer disposed on the bank structure, a second encapsulation layer disposed on the first encapsulation layer, and a third encapsulation layer disposed on the second encapsulation layer; and a touch layer disposed on the thin film encapsulation layer and comprising a plurality of touch insulating layers and a touch electrode disposed between the plurality of touch insulating layers, wherein the pad structure further comprises a third pad layer disposed on the second pad layer and disposed on the same layer as the touch electrode.

17. The electronic device of claim 15, wherein the first bank layer and the first pad layer includes aluminum (Al), and wherein the second bank layer and the second pad layer includes titanium (Ti).

18. The electronic device of claim 15, wherein the common electrode is in direct contact with a side surface of the first bank layer.

19. The electronic device of claim 15, wherein the inorganic insulating layer extends to the pad area and is disposed on the pad organic layer, and wherein the first pad layer is disposed directly on the inorganic insulating layer.

20. The electronic device of claim 15, further comprising a plurality of dams at least partially surrounding the display area and comprising a plurality of stacked sub-dams including an organic insulating material, wherein the pad organic layer contains a same material as any one of the plurality of stacked sub-dams.

* * * * *